United States Patent
Lu et al.

(10) Patent No.: US 11,487,507 B2
(45) Date of Patent: Nov. 1, 2022

(54) MULTI-BIT COMPUTE-IN-MEMORY (CIM) ARRAYS EMPLOYING BIT CELL CIRCUITS OPTIMIZED FOR ACCURACY AND POWER EFFICIENCY

(71) Applicant: QUALCOMM Incorporated, San Diego, CA (US)

(72) Inventors: Ye Lu, San Diego, CA (US); Zhongze Wang, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 287 days.

(21) Appl. No.: 16/868,202

(22) Filed: May 6, 2020

(65) Prior Publication Data

US 2021/0349689 A1 Nov. 11, 2021

(51) Int. Cl.
*G06F 7/523* (2006.01)
*G11C 11/412* (2006.01)
*G11C 11/419* (2006.01)
*G06N 3/063* (2006.01)

(52) U.S. Cl.
CPC ............ *G06F 7/523* (2013.01); *G11C 11/412* (2013.01); *G11C 11/419* (2013.01); *G06N 3/0635* (2013.01)

(58) Field of Classification Search
None
See application file for complete search history.

(56) References Cited

U.S. PATENT DOCUMENTS

| | | | |
|---|---|---|---|
| 5,859,795 A | 1/1999 | Rolandi | |
| 10,534,840 B1 * | 1/2020 | Petti | G11C 7/12 |
| 2016/0232951 A1 | 8/2016 | Shanbhag et al. | |
| 2019/0042199 A1 | 2/2019 | Sumbul et al. | |
| 2020/0105337 A1 * | 4/2020 | Chen | H01L 27/1104 |
| 2020/0110987 A1 | 4/2020 | Schie et al. | |
| 2020/0133990 A1 | 4/2020 | Mathuriya et al. | |

FOREIGN PATENT DOCUMENTS

WO 2019246064 A1 12/2019

OTHER PUBLICATIONS

International Search Report and Written Opinion for International Patent Application No. PCT/US2021/024558, dated Jul. 12, 2021, 16 pages.

\* cited by examiner

*Primary Examiner* — Jany Richardson
(74) *Attorney, Agent, or Firm* — Qualcomm Incorporated

(57) ABSTRACT

A bit cell circuit of a most-significant bit (MSB) of a multi-bit product generated in an array of bit cells in a compute-in-memory (CIM) array circuit is configured to receive a higher supply voltage than a supply voltage provided to a bit cell circuit of another bit cell corresponding to another bit of the multi-bit product. A bit cell circuit receiving a higher supply voltage increases a voltage difference between increments of an accumulated voltage, which can increase accuracy of an analog-to-digital converter determining a pop-count. A bit cell circuit of the MSB in the CIM array circuit receives the higher supply voltage to increase accuracy of the MSB which increases accuracy of the CIM array circuit output. A capacitance of a capacitor in the bit cell circuit of the MSB is smaller to avoid an increase in energy consumption due to the higher voltage.

19 Claims, 14 Drawing Sheets

MULTI-BIT COMPUTE-IN-MEMORY (CIM) ARRAYS EMPLOYING BIT CELL CIRCUITS OPTIMIZED FOR ACCURACY AND POWER EFFICIENCY

BACKGROUND

I. Field of the Disclosure

The technology of the disclosure relates generally to high performance computing memory and, more particularly, to compute-in-memory (CIM) arrays.

II. Background

Facial recognition is an example of a task that can be performed by a machine executing machine-learning software. In a learning phase, a set of facial images is evaluated by a computer and feedback is provided to indicate whether the evaluations are correct. To evaluate an image, algorithms are used to analyze the image as groups of pixels looking for particular facial features. Initially, the algorithms have no historical information to provide a point of reference. As more feedback is received, the algorithms become more accurate. Thousands of calculations are made in the process of evaluating a single image. These calculations can be implemented by a neural network framework made up of arrays of nodes organized in a structure similar to brain synapses. In computers, these nodes each perform a multiply-accumulate (MAC) operation. In this regard, FIG. 1 is an illustration of a node 100 of a neural network. The node 100 receives a set of inputs $X_0$-$X_M$ that are each multiplied by a corresponding weight value $W_0$-$W_M$, based on historical data, into respective products $P_0$-$P_M$. The products $P_0$-$P_M$ are summed into a sum SUM, and the node 100 generates an output OUTPUT that is a function of the sum SUM.

To implement neural networks in computer hardware, the multiply and accumulate functions can be performed in specialized processing circuits. As large amounts of input data, weight data, and output data must be transferred between the processing circuits and memory for thousands of calculations very quickly, a data transfer bottleneck can develop. A data transfer bottleneck can cause the processing circuits to be starved for data, causing them to idle, which extends execution time, wastes power, and increases the time a user must wait for results.

Compute-in-memory (CIM) arrays were developed to implement a node of a neural network framework without data transfer bottlenecks. A data transfer bottleneck is avoided by storing weight data within each bit of a CIM array and also performing a multiply operation within each bit. Neural networks are a form of artificial intelligence relied on for a high level of accuracy, so it is important that the CIM array generates accurate results. Since many bits of the CIM array perform operations simultaneously for thousands of calculations, speed and power efficiency are also important.

SUMMARY OF THE DISCLOSURE

Aspects disclosed herein include multi-bit compute-in-memory (CIM) arrays employing bit cell circuits optimized for accuracy and power efficiency. Multi-bit products of input bits and digital weight data are summed bitwise by accumulating voltages from bit cells in a same bit position of all the products. An accumulated voltage for each bit position is converted to a digital pop-count by an analog-to-digital converter (ADC). The pop-count in a most-significant bit (MSB) is most significant to the accuracy of the sum, like the left-most digit in a decimal number. In an exemplary aspect, a bit cell circuit of a MSB of a multi-bit product generated in an array of bit cells in a CIM array circuit is configured to receive a higher supply voltage than a supply voltage provided to a bit cell circuit of another bit cell corresponding to another bit of the multi-bit product. A bit cell circuit receiving a higher supply voltage increases a voltage difference between increments of an accumulated voltage, which can increase accuracy of an ADC determining a pop-count. A bit cell circuit of the MSB in the CIM array circuit is configured to receive the higher supply voltage to increase accuracy of the MSB, which increases accuracy of the CIM array circuit output. In another exemplary aspect, a capacitance of a capacitor in the bit cell circuit of the MSB is smaller than in the bit cell circuit of the other bit cell corresponding to the bit of the multi-bit product to avoid an increase in energy consumption due to the higher voltage.

In this regard, in one aspect, a CIM array circuit is disclosed. The CIM array circuit includes a first array of bit cells configured to generate a first multi-bit product. The first array of bit cells includes a first MSB bit cell corresponding to an MSB of the first multi-bit product and a first less-significant bit cell corresponding to a less-significant bit of the first multi-bit product than the MSB. Each bit cell of the first array of bit cells includes a bit cell circuit. Each bit cell circuit includes a plurality of inputs each configured to receive a binary input signal and a capacitor configured to be set to a voltage indicating a binary output. Each bit cell circuit is configured to store a bit of a weight array and generate the binary output based on the plurality of inputs and the bit of the weight array. A bit cell circuit of the first MSB bit cell is configured to receive a first voltage that is higher than a second voltage received in a bit cell circuit of the first less-significant bit cell.

In another aspect, a CIM array circuit is disclosed. The CIM array circuit includes an array of bit cells configured to generate a multi-bit product. Each bit cell includes a bit cell circuit. Each bit cell circuit includes a plurality of inputs based on a binary input signal and a capacitor configured to be set to a voltage indicating a binary output. Each bit cell circuit is configured to store a bit of a weight array and generate the binary output based on the plurality of inputs and the bit of the weight array. A capacitance of a capacitor in a first bit cell circuit is smaller than a capacitance of a capacitor in another bit cell circuit.

DETAILED DESCRIPTION

Figure 1:
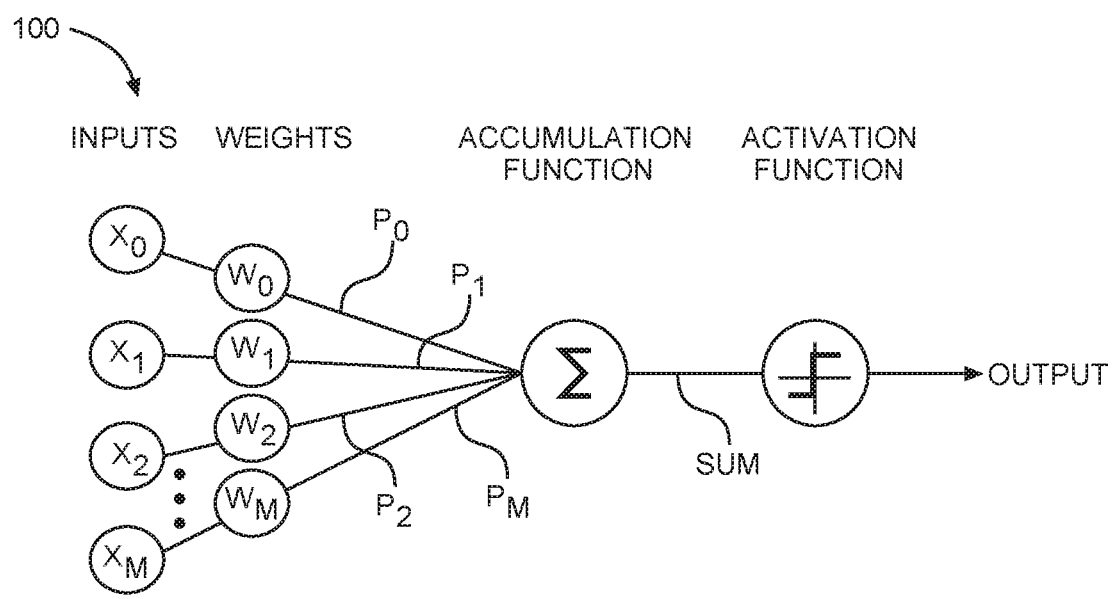
FIG. 1 is a schematic diagram of a node configured to perform a multiply-accumulate (MAC) operation in a neural network.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include multi-bit compute-in-memory (CIM) arrays employing bit cell circuits optimized for accuracy and power efficiency. Multi-bit products of input bits and digital weight data are summed bitwise by accumulating voltages from bit cells in a same bit position of all the products. An accumulated voltage for each bit position is converted to a digital pop-count by an analog-to-digital converter (ADC). The pop-count in a most-significant bit (MSB) is most significant to the accuracy of the sum, like the left-most digit in a decimal number. In an exemplary aspect, a bit cell circuit of a MSB of a multi-bit product generated in an array of bit cells in a CIM array circuit is configured to receive a higher supply voltage than a supply voltage provided to a bit cell circuit of another bit cell corresponding to another bit of the multi-bit product. A bit cell circuit receiving a higher supply voltage increases a voltage difference between increments of an accumulated voltage, which can increase accuracy of an ADC determining a pop-count. A bit cell circuit of the MSB in the CIM array circuit is configured to receive the higher supply voltage to increase accuracy of the MSB, which increases accuracy of the CIM array circuit output. In another exemplary aspect, a capacitance of a capacitor in the bit cell circuit of the MSB is smaller than in the bit cell circuit of the other bit cell corresponding to the bit of the multi-bit product to avoid an increase in energy consumption due to the higher voltage.

Exemplary aspects disclosed herein include multi-bit CIM arrays employing bit cell circuits optimized for accuracy and power efficiency. Before discussing detailed aspects of multi-bit CIM arrays employing bit cell circuits optimized for accuracy and power efficiency starting at FIG. 3A, a CIM array circuit 200 that does not include bit cell circuits optimized for accuracy and power efficiency is illustrated in FIGS. 2A-2C and discussed herein.

Figure 2A:
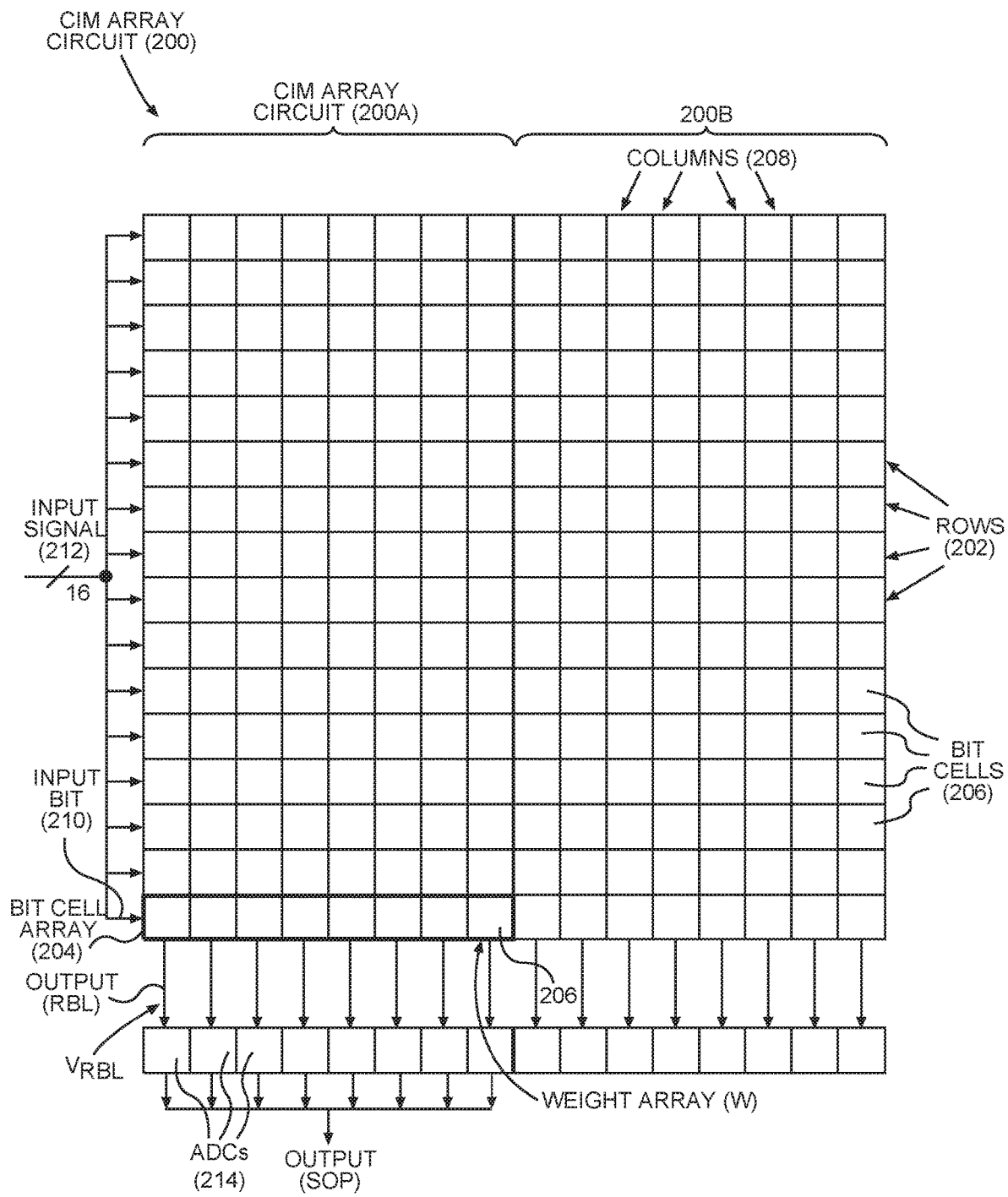
FIG. 2A is a schematic view of a compute-in-memory (CIM) array circuit including two functionally distinct CIM array circuits each including rows of multi-bit arrays each configured to store multi-bit weight data and a row input bit and generate a multi-bit product.
Figure 2B:
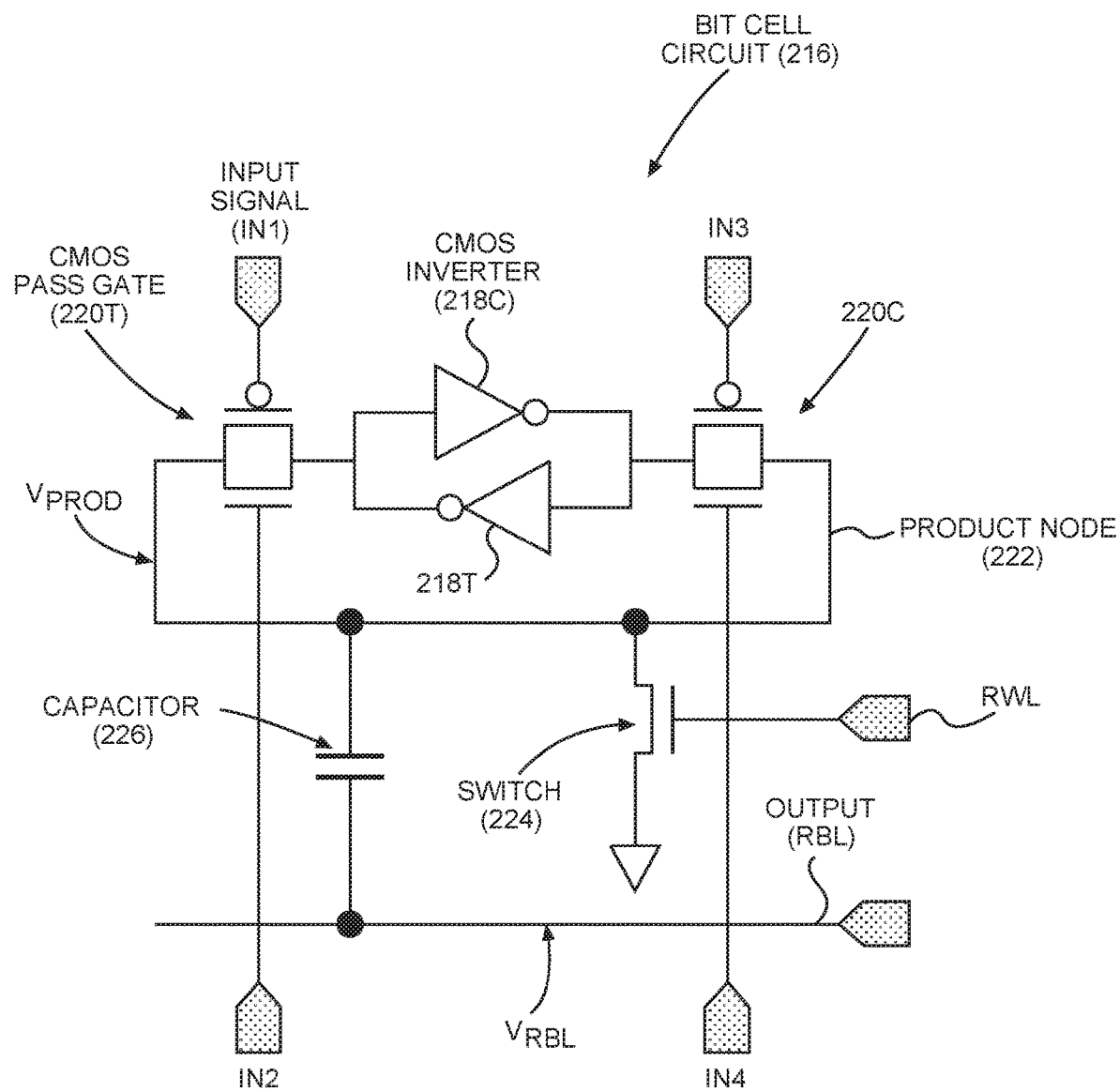
FIG. 2B is a schematic diagram of a bit cell circuit employed in each bit cell of the CIM array circuit in FIG. 2A.

As illustrated in FIG. 2A, a CIM array circuit 200 functions as two separate CIM array circuits 200A and 200B, each including sixteen (16) bit cell rows 202 with each row 202 including a bit cell array 204 of eight (8) bit cells 206. Bit cells 206 in a same bit position in the respective bit cell arrays 204 form columns 208. In this example, each of the CIM array circuits 200A and 200B can identically implement the multiply and accumulate components (MAC) operations described with reference to the neural network node 100 in FIG. 1, so only the CIM array circuit 200A is described. The description of the CIM array circuit 200A is equally applicable to the CIM array circuit 200B.

The bit cell array 204 included in each of the rows 202 in the CIM array circuit 200A is a one-dimensional 8-bit array of the bit cells 206. The bit cell array 204 is configured to store an 8-bit weight array W. Each bit cell 206 of the bit cell array 204 receives a same input bit 210 of a multi-bit (e.g., 16 bit) input signal 212. The bit cell 206 multiplies the received input bit 210 by the respective bit of the weight array W stored in the bit cell 206 and generates a 1-bit product. Storing the weight array W in the bit cell array 204 reduces data transfer bottlenecks that would be caused by transferring the weight arrays W for every multiplication occurring in the bit cell arrays 204 in the CIM array circuit 200.

The CIM array circuit 200 can be used to perform the MAC function of the neural network node 100 in FIG. 1. Comparing the node 100 in FIG. 1 to the OM array circuit 200, the inputs $X_0$-$X_M$ of the node 100 correspond to the multi-bit input signal 212 of which one input bit 210 is received in each of the respective rows 202. Each of the weights $W_0$-$W_M$ of FIG. 1 corresponds to the weight array W stored in the bit cell array 204 in each row 202. The bit cell array 204 in each row 202 implements the multiply function of the MAC operation to generate a result that corresponds to one of the products $P_0$-$P_M$.

The result of the multiply function in each bit cell array 204 is a multi-bit binary value. In this example, the multi-bit value is an 8-bit value, with one (1) bit generated in each bit cell 206. The accumulation function of the MAC operation performed in the CIM array circuit 200A is a column-wise accumulation of the 1-bit results from all the bit cells 206 in a column 208. For example, the left-most bit cells 206 in the bit cell array 204 of every row 202 are accumulated on an output read bit line ("output RBL") for the left-most column 208. The next bit cells 206 in the bit cell array 204 in each row 202 are accumulated by ADCs 214, as described below, on the output RBL for the next column, and so on, with one output RBL for each of the columns 208. The outputs RBL for each of the eight (8) columns 208 are evaluated, and an 8-bit output SOP including the outputs RBL for the columns 208 is generated as the output of the CIM array circuit 200A. The output SOP corresponds to the output SUM in FIG. 1.

As noted above, each bit cell 206 of the bit cell array 204 multiplies one bit of the weight array W by the input bit 210 of the corresponding row 202. Binary multiplication of two 1-bit values may be implemented as a binary exclusive NOT-OR (NOR) (XNOR) operation. To store a bit of the weight array W and perform an XNOR operation of that bit with the input bit 210, each bit cell 206 includes a bit cell circuit 216, as illustrated in FIG. 2B. The bit cell circuit 216 can be provided as a static random access memory (RAM) (SRAM) circuit that includes cross-coupled complementary metal-oxide semiconductor (CMOS) inverters 218T and 218C to store a bit of the weight array W, and CMOS pass gates 220T and 220C to store and control access to the stored bit of the weight array W. The pass gates 220T and 220C are controlled by input signals IN1-IN4. The input signals IN1-IN4 are generated from the input bit 210 received in the row 202. The bit cell circuit 216 also includes a product node 222 coupled to each of the pass gates 220T and 220C. The product node 222 is set to a voltage $V_{PROD}$ corresponding to the 1-bit result of the XNOR operation of the input bit 210 and the stored bit of the weight array W. The XNOR operation is accomplished by the input signals IN1-IN4 and the pass gates 220T and 220C in a manner that is not relevant to the present disclosure and therefore not described in detail herein, but should be understood by persons of skill in the art. The bit cell circuit 216 also includes a switch 224 controlled by an input read word line (RWL) for setting a bit value of the weight array W to be stored in the bit cell circuit 216.

The result of the XNOR operation is a 1-bit binary value indicated on the product node 222 as the voltage $V_{PROD}$. For example, a binary "0" may be indicated as 0 volts (V) on the product node 222, and a binary "1" may be indicated as a supply voltage $V_{SUP}$. The supply voltage $V_{SUP}$ is a voltage provided to power the bit cell circuit 216. The voltage $V_{PROD}$ (i.e., either 0 V or $V_{SUP}$) is stored in a capacitor 226, which couples the voltage $V_{PROD}$ from the product node 222 of the bit cell circuit 216 to the output RBL. The CIM array circuit 200A includes a respective output RBL for each of the columns 208, and the output RBL for a given column 208 is coupled to all the bit cells 206 of the column 208 in this manner. Thus, a voltage $V_{RBL}$ on the output RBL is an accumulation of the voltages $V_{PROD}$ provided by each of the bit cells circuits 216 in the column 208.

Each column 208 has sixteen (16) bit cells 206 (one for each row 202) and each bit cell 206 contributes either 0 V or the supply voltage $V_{SUP}$ to the voltage $V_{RBL}$. Therefore, the voltage $V_{RBL}$ can range from 0 V, when all sixteen (16) of the bit cells 206 in a column 208 have a binary "0" (0 V) on their product nodes 222, to a voltage $V_{MAX}$, when all sixteen (16) of the bit cells 206 in a column 208 have a binary "1" (i.e., supply voltage $V_{SUP}$) on their product nodes 222. The number of binary "1"s (e.g., the number of bit cell circuits 216 contributing the supply voltage $V_{SUP}$ on the output RBL) in the column 208 is known as a pop-count. In the example of the CIM array circuit 200A, the pop-count for a column 208 can range from 0 to 16, and the analog voltage V. RBL assumes a voltage proportional to the maximum voltage $V_{MAX}$ based on the pop-count. Theoretically, the voltage $V_{RBL}=(V_{MAX}*\text{pop-count})/16$, although the actual voltage $V_{RBL}$ can vary due to factors such as thermal noise.

In an example, when the pop-count=8 in a column 208, the voltage $V_{RBL}$ on the output RBL for that column 208 should be $(V_{MAX}*8)/16$ or $V_{MAX}/2$. An ADC 214 in each column 208 is employed to evaluate the voltage $V_{RBL}$ on the output RBL and generate a digital value indicating the pop-count of the column 208, In the example above, the voltage $V_{RBL}$ having a value of $V_{MAX}/2$ indicates the pop-count=8. Accuracy of the CIM array circuit 200A depends on the ability of the ADCs 214 in each column 208 to correctly distinguish between pop-counts represented by the accumulated analog voltage $V_{RBL}$ on the output RBL for the respective column 208.

The output SOP of the CIM array circuit 200A is a one-dimensional array of the eight (8) pop-counts from the columns 208 of the CIM array circuit 200A, with the least-significant bit (LSB) of the output generated in the right-most column 208 of the CIM array circuit 200A and the MSB of the output SOP generated in the left-most column 208. The left-most bit cell column 208 may also be referred to herein as the MSB column 208. The pop-count of the column 208 corresponding to the MSB column 208 of the bit cell arrays 204 in each row 202 is the most significant data in the output SOP. In other words, the pop-count in the MSB column 208 of the output SOP is most significant to the accuracy of the neural network node implemented by the CIM array circuit 200A, like the left-most digit in a decimal number. Therefore, accuracy of the pop-count in the MSB column 208 is more important than the accuracy of pop-counts in the other columns 208. This means that the ability of an ADC 214 to correctly determine the pop-count represented by the analog voltage $V_{RBL}$ is more important in the MSB column 208 than in any other column 208 of the CIM array circuit 200A.

As noted in regard to FIGS. 2A and 2B, the accuracy of the CIM array circuit 200 depends on the ability of the ADCs 214 to correctly distinguish between pop-counts represented by the accumulated analog voltage $V_{RBL}$ on the output RBL. An analog voltage level corresponding to a pop-count is proportional to the voltage $V_{MAX}$. As an example, if $V_{MAX}$=16 V, then a voltage difference between respective pop-counts in a CIM array circuit with 16 bit cells 206 in each column 208 would be $V_{MAX}/16$ or 1 V. However, the maximum voltage at which transistors operate in an integrated circuit (IC) is much less than 16 V, and may be in the range of 0.7 to 1.8 V. Distinguishing between pop-counts becomes more difficult as the incremental differences between voltages corresponding to adjacent pop-counts become smaller. In the presence of interference in an IC, which may cause variation in the voltage $V_{RBL}$, it becomes even more difficult for the ADCs 214 to accurately distinguish between two pop-counts that may be on opposite sides of a detected voltage $V_{RBL}$.

In exemplary aspects disclosed herein, a bit cell circuit configured to receive a higher supply voltage increases a voltage difference between increments of an accumulated voltage. An increased supply voltage in the bit cell circuits of bit cells in a same bit position of all the bit cell arrays can increase accuracy of an ADC determining a pop-count for the bit position. In this regard, a bit cell circuit employed in a bit cell corresponding to a MSB of a multi-bit product generated by an array of bit cells in a CIM array circuit may be configured to receive a higher supply voltage than a supply voltage received in a bit cell circuit employed in a less-significant bit cell corresponding to less-significant bits of the multi-bit product than the MSB.

Figure 3A:
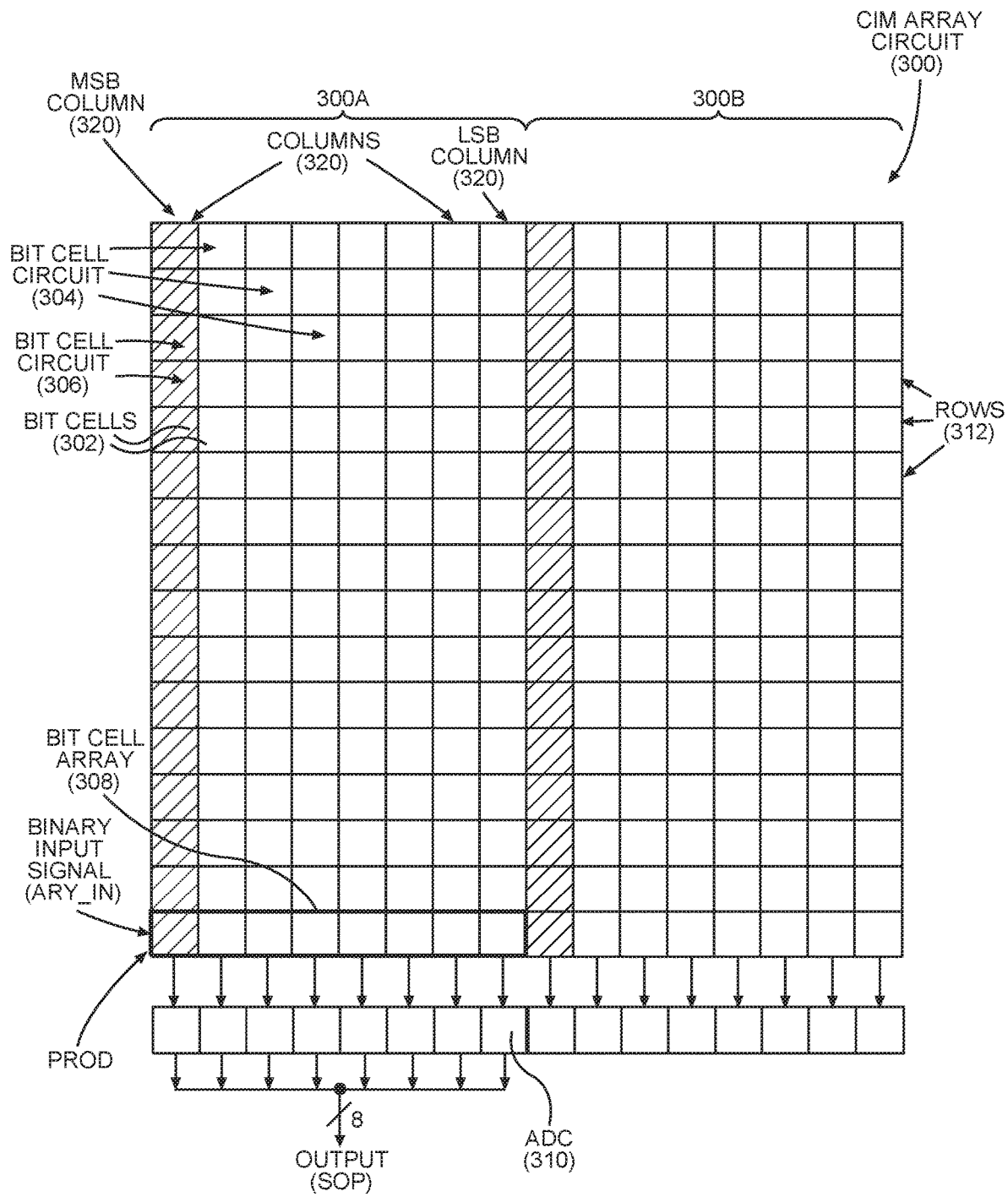
FIG. 3A is a schematic view of a CIM array circuit that includes a plurality of arrays including a plurality of bit cells including bit cell circuits configured to store multi-bit weight data and generate a multi-bit product, and the bit cell circuits corresponding to most-significant bits (MSBs) of the multi-bit products are configured to receive a higher supply voltage than bit cell circuits corresponding to other bits of the multi-bit products other than the MSB.
Figure 3B:
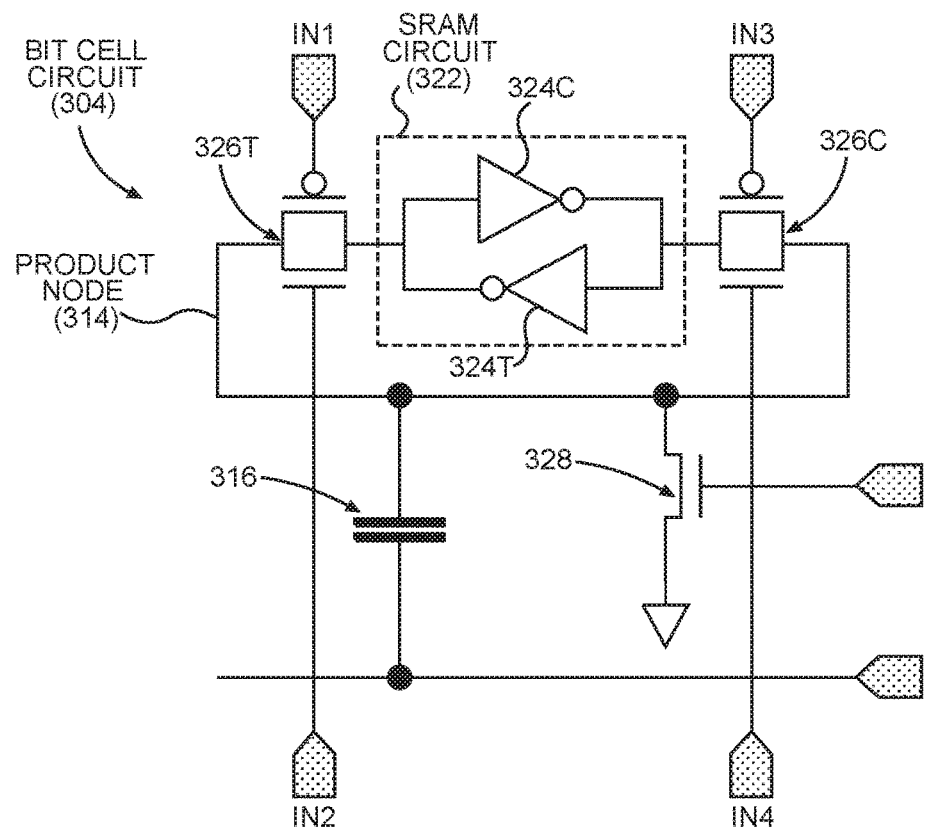
FIG. 3B is a schematic diagram of a bit cell circuit employed in bit cells corresponding to the other bits of the CIM array circuit in FIG. 3A.
Figure 3C:
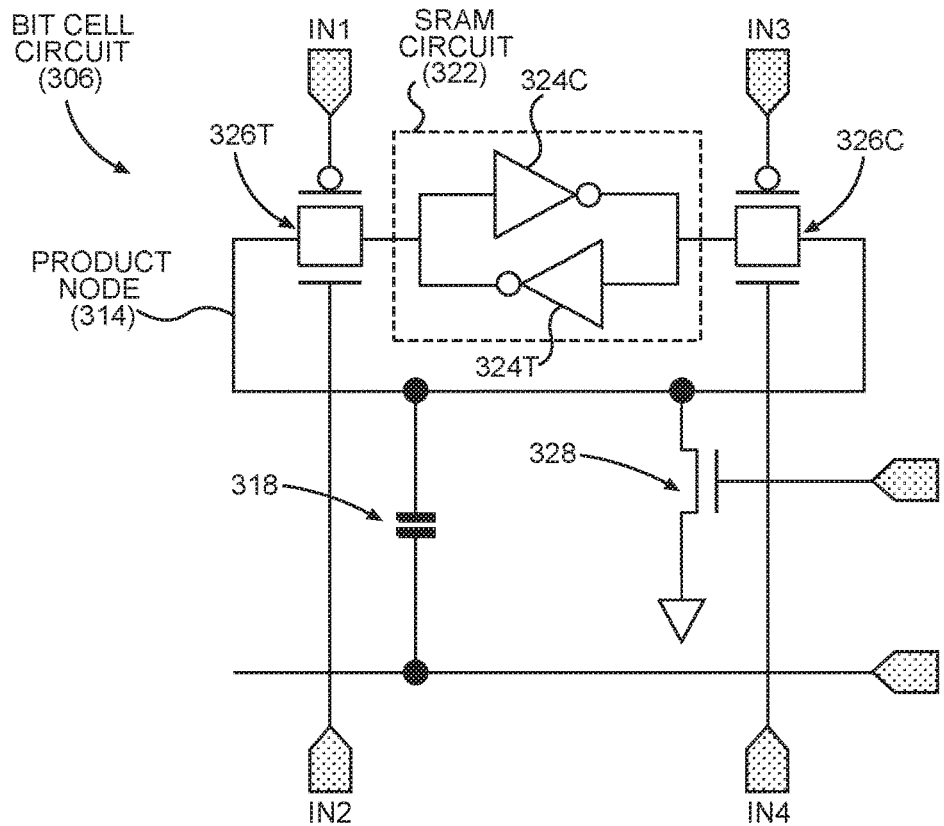
FIG. 3C is a schematic diagram of a bit cell circuit employed in the bit cells corresponding to the MSBs of the multi-bit products in the CIM array circuit in FIG. 3A, including transistors configured to receive a higher voltage and a capacitor having a smaller capacitance than in the bit cell circuit of the bit cells corresponding to the other bits.

In CIM array circuit 300, as disclosed herein with reference to FIGS. 3A-3C, bit cells 302 include a bit cell circuit 304 or a bit cell circuit 306. The bit cell circuit 304 and the bit cell circuit 306 are both structurally and functionally similar to the bit cell circuit 216 in FIG. 2A, but the bit cell circuit 306 is optimized to increase accuracy and reduce power consumption. For example, the bit cell circuit 306 is configured to receive a higher voltage $V_{SUPH}$ that is higher than a lower voltage $V_{SUPL}$ received in the bit cell circuit 304. The bit cell circuit 306 is employed in the bit cell 302 corresponding to the MSB of a multi-bit product PROD generated in a bit cell array 308. The bit cell circuit 304 is employed in other bit cells 302 corresponding to bits other than the MSB of the multi-bit product PROD, which are less-significant bits than the MSB in the multi-bit product PROD. The LSB of the multi-bit product PROD is one example of a less-significant bit than the MSB, and the LSB may be used herein to refer to a bit other than the MSB, but references herein to a less-significant bit or a bit other than the MSB are not referring exclusively to the LSB.

In the bit cells 302 that include the bit cell circuit 306, transistors (not shown) of the bit cell circuit 306 are configured to receive the higher voltage $V_{SUPH}$ and in bit cells 302 that include the bit cell circuit 304, transistors of the bit cell circuit 304 are configured to receive the lower voltage $V_{SUPL}$. The transistors in the bit cell circuit 306 are configured to receive the higher voltage $V_{SUPH}$ by having one or more of a thicker gate oxide and a longer gate length than the transistors employed in the bit cell circuit 306. Transistors receiving the higher voltage $V_{SUPH}$ can generate a higher maximum accumulated voltage $V_{MAXH}$ to increase a voltage difference between increments indicating respective pop-counts. Increasing the voltage difference between increments of the accumulated voltages of the bit cells 302 corresponding to the MSB of a multi-bit product PROD can improve the accuracy of an ADC 310 evaluating a pop-count of the MSB bit cells 302 compared to the ADCs 310 evaluating the pop-count of the bit cells 302 corresponding to other bits, such as the LSB, of the multi-bit product PROD.

Each row 312 of the CIM array circuit 300 includes the bit cell array 308 of the bit cells 302. The bit cell array 308 is configured to generate a multi-bit product PROD, including at least a MSB and a LSB. Individual bits of the multi-bit product PROD are indicated by the respective voltages $V_{PROD}$ (e.g., low and high voltage levels of $V_{PROD}$ indicate binary "0" and "1") on product nodes 314 of the bit cell circuits 304 and 306 in the bit cells 302 in the bit cell array 308. Each bit cell circuit 304, 306 includes a plurality of inputs IN1-IN4 that each receive a binary input signal ARY_IN, and a capacitor 316, 318 that stores a binary output as the voltage $V_{PROD}$. Each bit cell circuit 304, 306 is configured to store a bit of a weight array W, and generate the binary output voltage $V_{PROD}$ based on the plurality of inputs IN1-IN4 and the bit of the weight array W.

The supply voltage $V_{SUPH}$ received in the bit cell circuit 306 of the bit cell 302 corresponding to the MSB of the bit cell array 308 is higher than the supply voltage $V_{SUPL}$ of the bit cell circuit 304 of the bit cell 302 corresponding to the LSB of the bit cell array 308. In this regard, an ADC 310 that accumulates the binary output voltages $V_{PROD}$ of a column 320 corresponding to the MSB (also referred to herein as the "MSB column 320") of the bit cell array 308 is able to determine a pop-count with greater accuracy than an ADC 310 in a column 320 corresponding to the LSB ("LSB column 320"). Because the supply voltage $V_{SUPH}$ of the bit cell circuit 306 of the MSB is higher than the supply voltage $V_{SUPL}$ in the bit cell circuit 304 of the LSB, a maximum voltage $V_{MAXH}$ on the read bit line ("output RBL") for the column 320 corresponding to the MSB column 320 will be higher than a maximum voltage $V_{MAX}$ of the accumulated voltage $V_{RBL}$ on the output RBL for the LSB column 320. Due to the higher voltage $V_{MAXH}$, an incremental difference between respective pop-count voltages is greater and, therefore, can be determined with greater accuracy. For example, a supply voltage $V_{SUPH}$ of the bit cell circuits 306 in the column 320 for the MSB that is double the supply voltage $V_{SUPL}$ of the bit cell circuits 304 in the column 320 of the LSB can double the voltage $V_{MAX}$, which can double the difference in the voltage $V_{RBL}$ between respective pop-counts, and double the accuracy of the ADC 310 of the column 320 of the MSB.

Details of the bit cell circuits 304 and 306 are described with reference to FIGS. 3B and 3C. As noted above, the binary output voltage $V_{PROD}$ can be generated in the bit cell circuits 304, 306 by an XNOR operation of the binary input signal ARY_IN received at inputs IN1-IN4 and the bit of the weight array W that is stored in an SRAM circuit 322 in the bit cell circuits 304 and 306. The SRAM circuit 322 includes cross-coupled inverters 324T and 324C under the control of pass-gates 326T and 326C, Each of the inputs IN1-IN4 receives a binary true or complement version of the binary input signal ARY_IN that is received in the bit cell array 308. The cross-coupled inverters 324T and 324C, the pass-gates 326T and 326C, and a switch 328 in bit cell circuits 304, 306 are implemented as CMOS transistors.

The bit cell circuit 304 in FIG. 3B is employed in the column 320 corresponding to the LSB of the bit cell array 308. The bit cell circuit 306 in FIG. 3C, is employed in the column 320 corresponding to the MSB of the bit cell array 308. The cross-coupled inverters 324T and 324C, the pass-gates 326T and 326C, and the switch 328 in the bit cell circuits 304, 306 are implemented by transistors. A difference between the transistors in the bit cell circuit 304 and the bit cell circuit 306 is that the transistors in the bit cell circuit 306 are capable of receiving a higher voltage than the transistors in the bit cell circuit 304. Specifically, the transistors in the bit cell circuit 306 in FIG. 3C can receive the higher supply voltage $V_{SUPH}$ which is higher than the supply voltage $V_{SUPL}$ of the transistors in the bit cell circuit 304. The higher supply voltage $V_{SUPH}$ is possible because the transistors in the bit cell circuit 306 are fabricated for higher voltage operation. In one example, the thickness of a gate oxide in a transistor in the bit cell circuit 306 is greater than the thickness of a gate oxide in a transistor in the bit cell circuit 304. In another example, the gate length of a transistor in the bit cell circuit 306 is longer than a gate length in a transistor in the bit cell circuit 306. One or both of the thicker gate oxide and the longer gate length enable the transistors in the bit cell circuit 306 to receive a higher voltage than the bit cell circuit 304. If the bit cell circuit 306 used in every bit cell 302 in the MSB column 320 receives a supply voltage $V_{SUPH}$ that is twice the supply voltage $V_{SUPL}$ in the bit cell circuit 304 in the bit cells 302 in the LSB column 320, the accuracy of the MSB column 320 may be twice the accuracy of the LSB column 320.

However, in the bit cell circuits 304 and 306 in FIGS. 3B and 3C, energy is consumed each time the capacitors 316 and 318 are charged and discharged. The consumed energy in the bit cell circuit 304 is proportional to $C*V_{SUPL}^2$, where C is the effective storage capacitance, and the supply voltage $V_{SUPL}$ is the voltage to which the capacitor 316 is charged. In the bit cell circuit 306 in FIG. 3C, a supply voltage $V_{SUPH}$ that is increased over the supply voltage $V_{SUPL}$ by 2× (i.e., two times) will increase dynamic energy consumption by 4× (four times). To minimize the increase in energy consumption caused by the increased supply voltage $V_{SUPH}$, C can be reduced to Cmin, which is defined by an acceptable thermal noise ceiling KT/C, or even slightly lower, where C is capacitance, T is temperature, and K is the Boltzman constant. In one example, the capacitance of the capacitor 318 in the bit cell circuit 306 in FIG. 3C, which is employed in the MSB column 320, is smaller than the capacitance of the capacitor 316 in the bit cell circuit 304 employed in the LSB column 320. The capacitance of the capacitor 318 may be reduced or smaller than the capacitance of the capacitor 316 by the capacitor 318 in FIG. 3C having a smaller physical size, in particular the area, compared to the capacitor 316 in FIG. 3B.

The capacitors 318 of bit cell circuits 306 in the bit cells 302 in the MSB columns 320 of the bit cell array 308 in every row 312 of the CIM array circuit 300 are coupled to a same output RBL. The bit cell circuits 306 couple a higher supply voltage $V_{SUPH}$ onto the output RBL for the MSB column 320 than the bit cell circuits 304 in the other columns 320 couple onto the output RBL, but the power consumption caused by the higher supply voltage $V_{SUPH}$ is mitigated by the reduced capacitance in the smaller capacitor 318 in FIG. 3C.

The higher supply voltage $V_{SUPH}$ each bit cell circuit 306 increases the maximum voltage of the voltage $V_{RBL}$ to the voltage $V_{MAXH}$ which increases the voltage difference between voltages corresponding to respective pop-counts. In this regard, the accuracy of the ADC 310 in the MSB column 320 is increased. The accuracy of the MSB column 320 is of the greatest significance compared to any of the other columns 320 of the CIM array circuit 300. Although the additional energy consumption in the MSB columns 320 due to the higher supply voltage $V_{SUPH}$ is mitigated by the reduced capacitance of the capacitor 318, transistors receiving the higher supply voltage $V_{OPH}$ may be larger and occupy more area than the transistors in the bit cell circuit 304. For the increased accuracy of the MSB column 320, the increased area is an accepted trade-off in the CIM array circuit 300, but the accuracy of other columns 320 is less significant and therefore such trade-off is not made in the other columns 320 in the CIM array circuit 300.

Figure 4A:
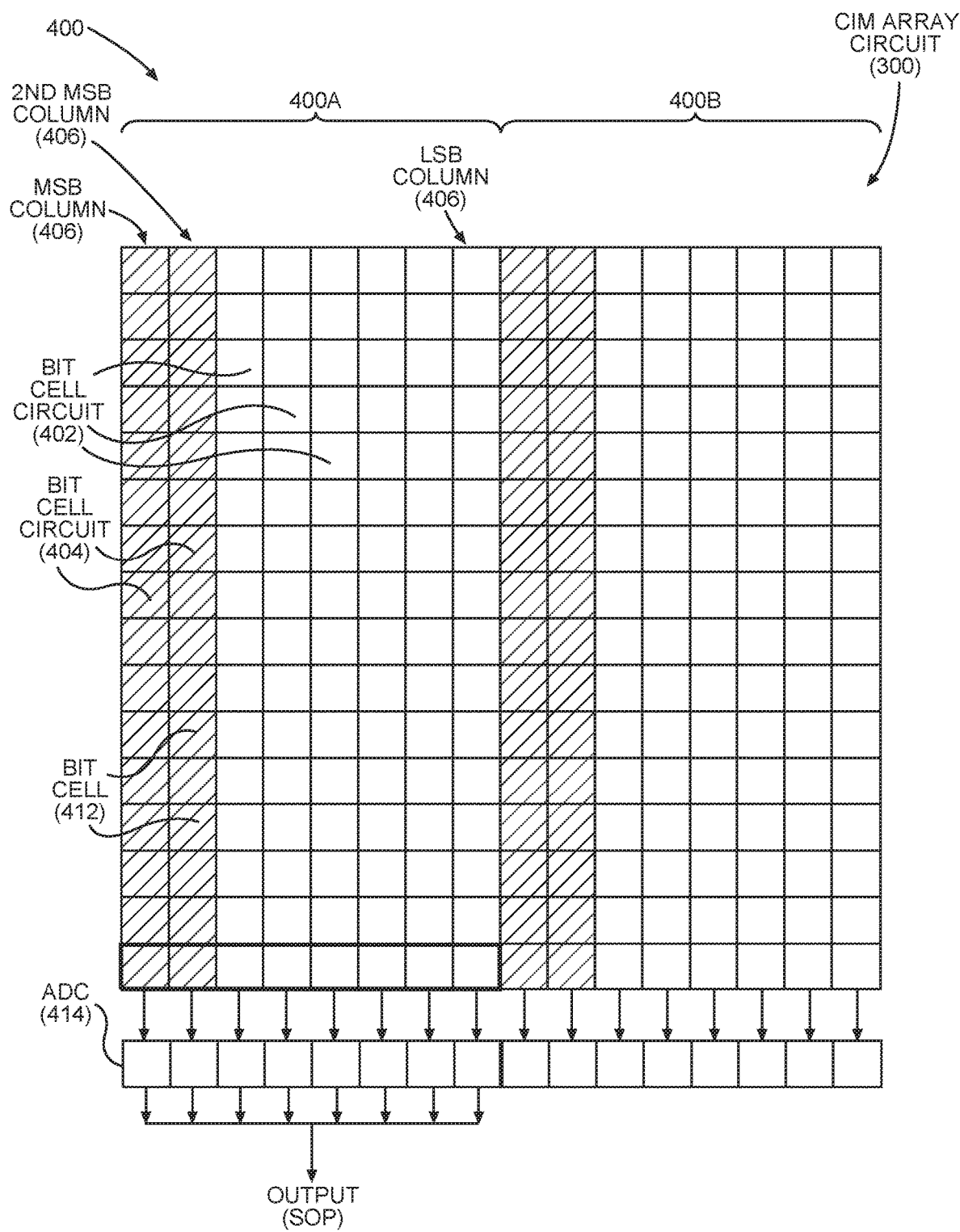
FIG. 4A is a schematic view of another exemplary CIM array circuit that is similar to the CIM array circuit in FIG. 3A, but includes bit cell circuits in bit cells corresponding to the MSBs and also to second-most-significant bits ($2^{nd}$ MSBs) of multi-bit products that are configured to receive a higher supply voltage than the bit cell circuits in the bit cells corresponding to other bits of the multi-bit products other than the MSB.
Figure 4B:
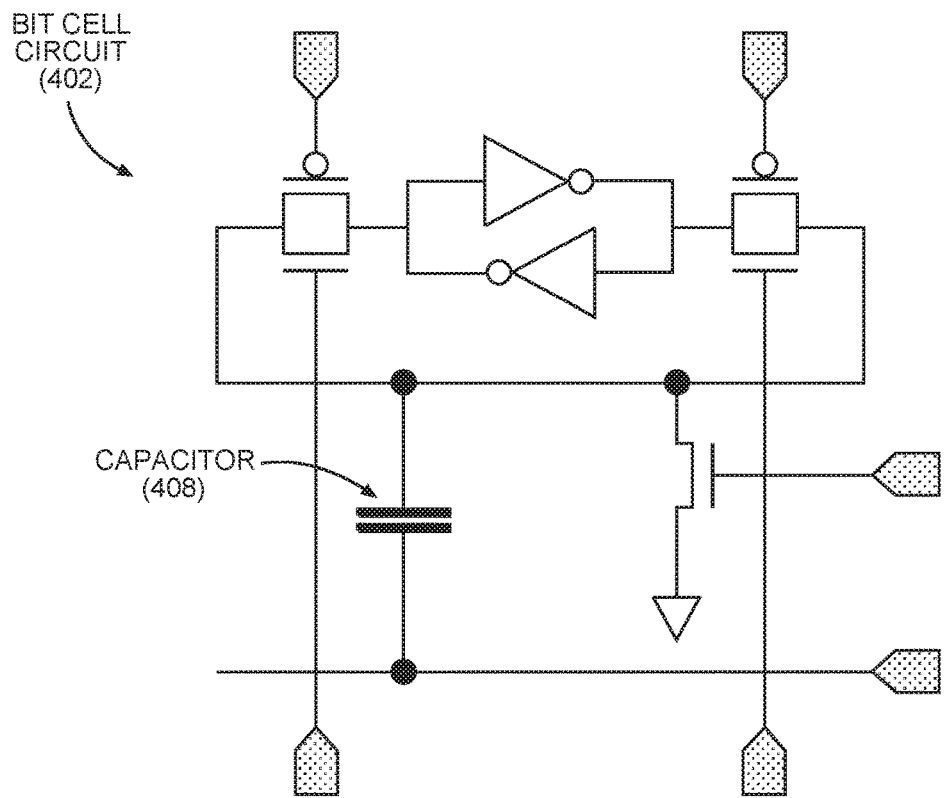
FIG. 4B is a schematic diagram of a bit cell circuit employed in bit cells corresponding to the other bits in the CIM array circuit in FIG. 4A.
Figure 4C:
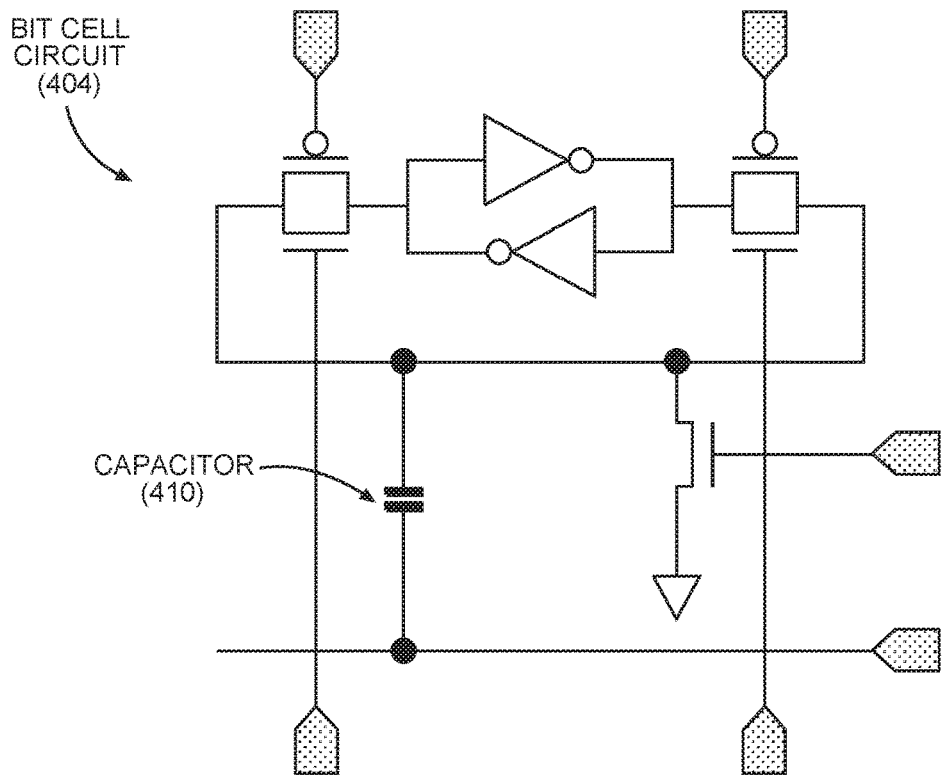
FIG. 4C is a schematic diagram of a bit cell circuit employed in bit cells corresponding to the MSBs and the $2^{nd}$ MSBs of the multi-bit products in the CIM array circuit in FIG. 4A, including higher voltage transistors and a smaller capacitor than the bit cell circuits in the bit cells corresponding to the other bits.

Another exemplary CIM array circuit 400, which includes functional CIM array circuits 400A and 400B, is illustrated in FIGS. 4A-4C. Bit cell circuits 402 and 404 in FIGS. 4B and 4C, respectively, correspond to the bit cell circuits 304 and 306 described above with respect to the CIM array circuit 300 in FIGS. 3A-3C. The LSB columns 406 of the CIM array circuits 400A and 400B include the bit cell circuits 402. The MSB columns 406 of the CIM array circuits 400A and 400B include the bit cell circuits 404 employing transistors having a higher supply voltage than the bit cell circuits 402 in the LSB columns 406, and having a capacitor 410 with a smaller capacitance than a capacitor 408 in the bit cell circuit 402 in FIG. 4B. Thus, the CIM array circuits 400A and 400B employ bit cell circuits 404 in the MSB columns 406 that are optimized for accuracy and power as discussed above with regard to the MSB columns 320 in the CIM array circuits 300A and 300B.

The CIM array circuits 400A and 400B differ from the CIM array circuits 300A and 300B with regard to the second-most-significant bit ($2^{nd}$ MSB) columns 406. In the UM array circuit 400, the bit cell circuits 404 of FIG. 4C, which receive the higher supply voltage $V_{SUPH}$, are also employed in the bit cells 412 in the $2^{nd}$ MSB columns 406 as well as in the MSB columns 406. The higher supply voltage $V_{SUPH}$ increases accuracy of the ADCs 414 determining pop-counts in the $2^{nd}$ MSB. Having higher accuracy in both the MSB columns 404 and the $2^{nd}$ MSB columns 404 increases the accuracy of the CIM array circuits 400A and 400B with respect to the accuracy of the CIM array circuits 300A and 300B. Due to the higher supply voltage $V_{SUPH}$ in the bit cell circuits 404, energy consumption in the $2^{nd}$ MSB column 406 increases to the same extent as in the MSB column 406. The accuracy of the ADC 414 in the $2^{nd}$ MSB column 406 is not as significant to an accurate output SOP of the CIM array circuits 400A and 400B as the accuracy of the MSB column 406. Therefore, the motivation to exchange increased energy consumption for increased accuracy is lower with regard to the $2^{nd}$ MSB column 406 than the MSB column 406. However, where concern for higher accuracy exceeds concerns about energy consumption, the CIM array circuits 400A and 400B offer a benefit over the CIM array circuits 300A and 300B.

Another exemplary CIM array circuit 500, which includes functional CIM array circuits 500A and 500B, is illustrated in FIGS. 5A-5D. The bit cell circuits 502 and 504 in FIGS. 5B and 5C, respectively, correspond to the bit cell circuits 302 and 304 described above with respect to the CIM array circuit 300 in FIGS. 3A-3C. The LSB columns 506 of the CIM array circuits 500A and 500B include the bit cell circuits 502. The MSB columns 506 of the CIM array circuits 500A and 500B include the bit cell circuits 504 employing transistors having a higher supply voltage than the bit cell circuits 502 in the LSB columns 504, and having a capacitor 510 with a smaller capacitance than a capacitor 508 in the bit cell circuit 502 in FIG. 5B. Thus, the CIM array circuits 500A and 500B employ bit cell circuits 504 in the MSB columns 506 that are optimized to increase accuracy of an ADC 512 determining a pop-count. The MSB columns 506 are also optimized to mitigate power consumption as discussed above with regard to the MSB columns 320 in the CIM array circuits 300A and 300B.

Figure 5A:
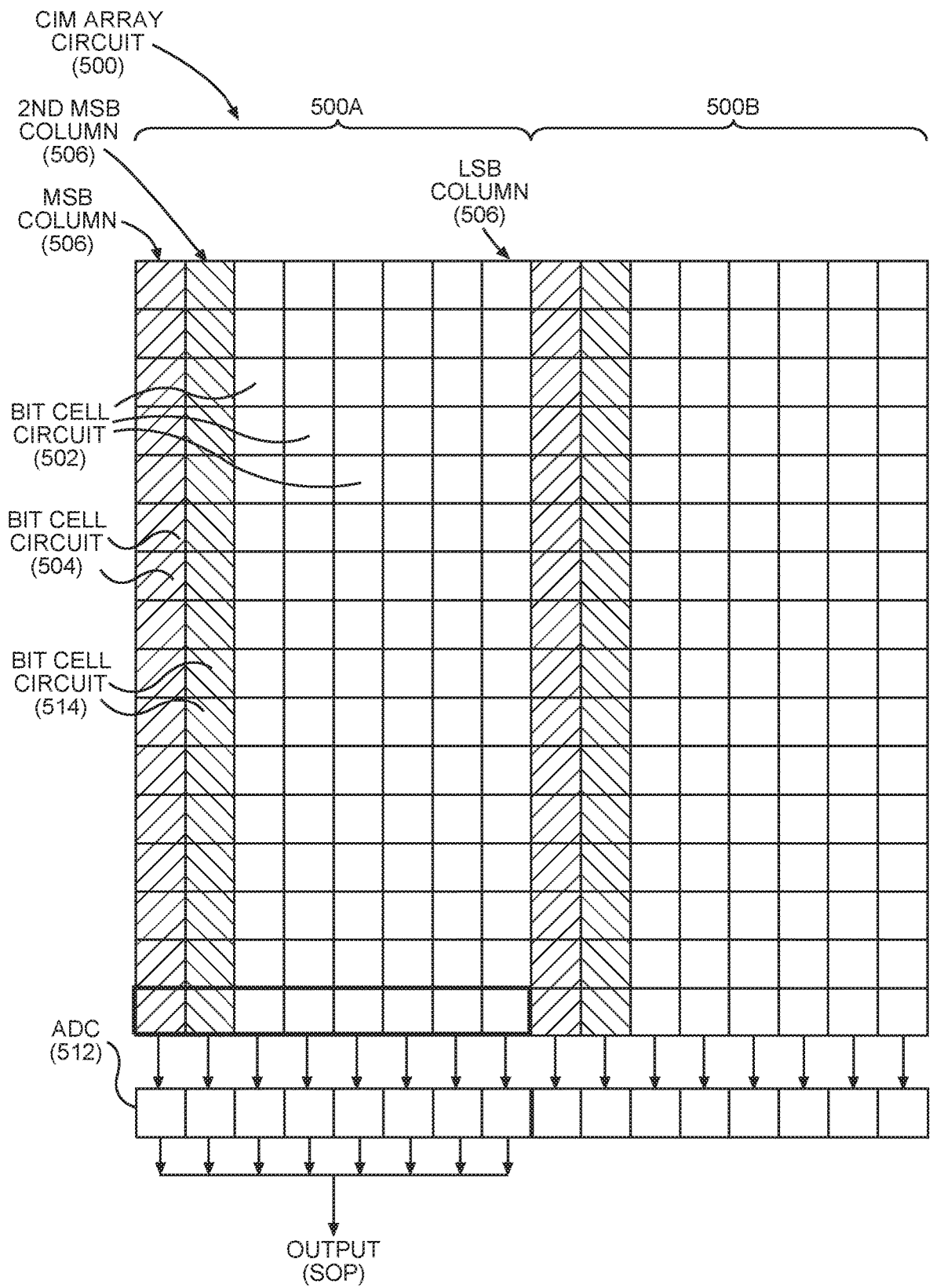
FIG. 5A is a schematic view of a CIM array circuit similar to the CAM array circuit in FIG. 3A in which bit cell circuits in bit cells corresponding to the MSBs and the $2^{nd}$ MSBs of the multi-bit products are configured to receive a higher supply voltage than bit cell circuits in bit cells corresponding to other bits of the multi-bit products other than the MSBs, and each bit cell circuit in the bit cells corresponding to the MSBs includes a capacitor having a smaller capacitance than the bit cell circuits of the bit cells corresponding to the other bits.
Figure 5B:
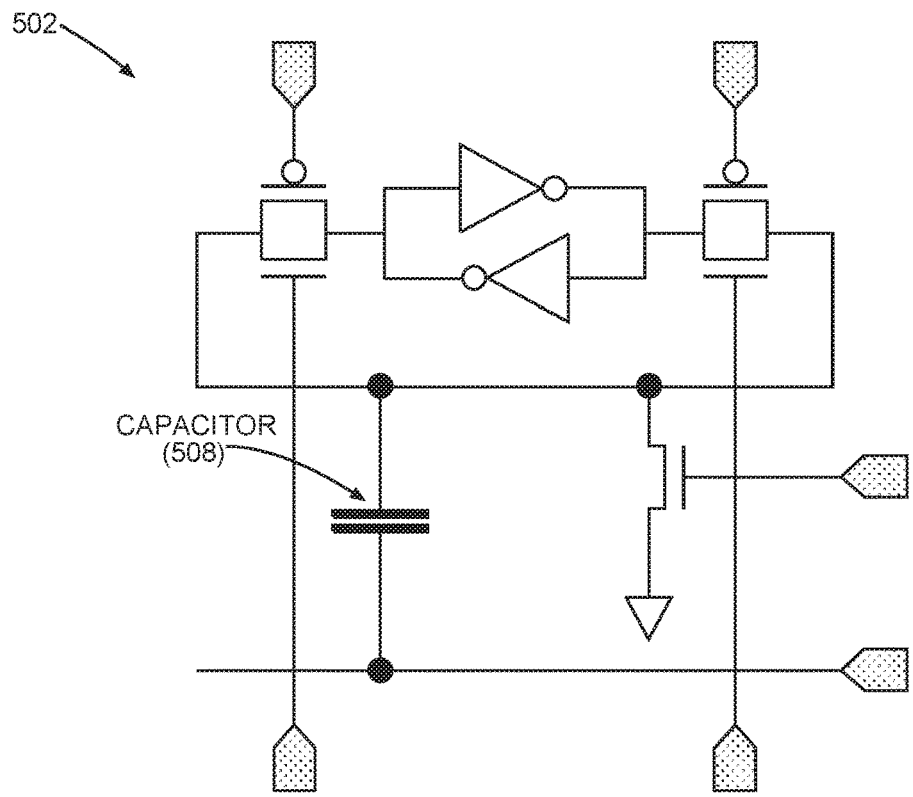
FIG. 5B is a schematic diagram of a bit cell circuit employed in the bit cells corresponding the other bits in the CIM array circuit in FIG. 5A.
Figure 5C:
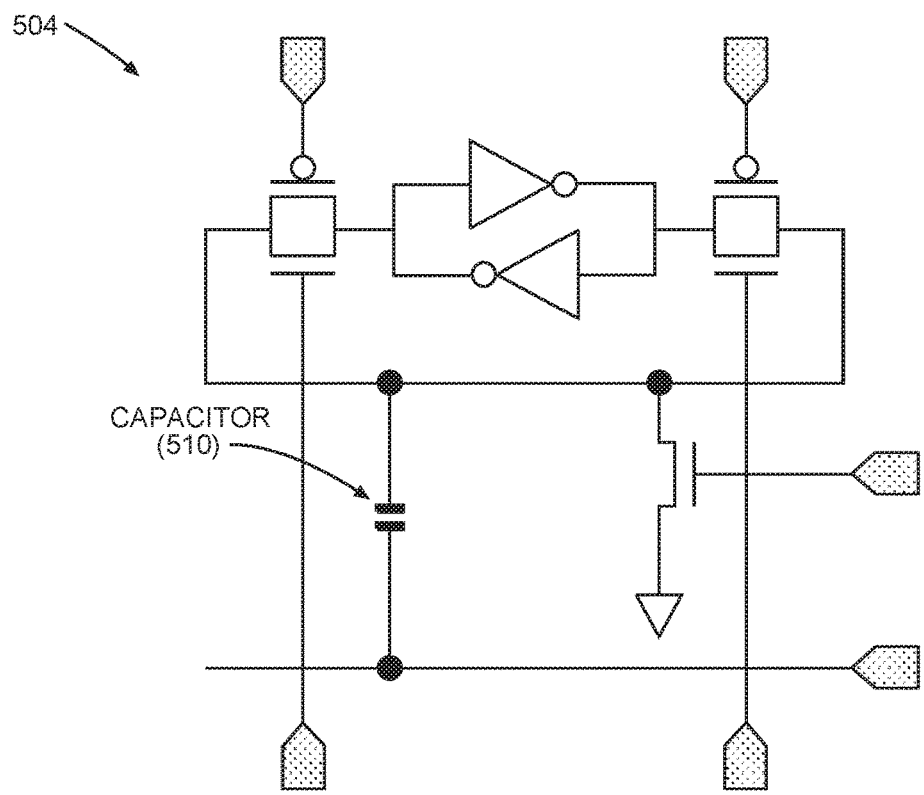
FIG. 5C is a schematic diagram of a bit cell circuit employed in a bit cell corresponding to the $2^d$ MSBs of the multi-bit products in the CIM array circuit in FIG. 5A, including transistors configured to receive a higher supply voltage and a capacitor having a same capacitance as the bit cell circuits in the bit cells corresponding to the other bits.
Figure 5D:
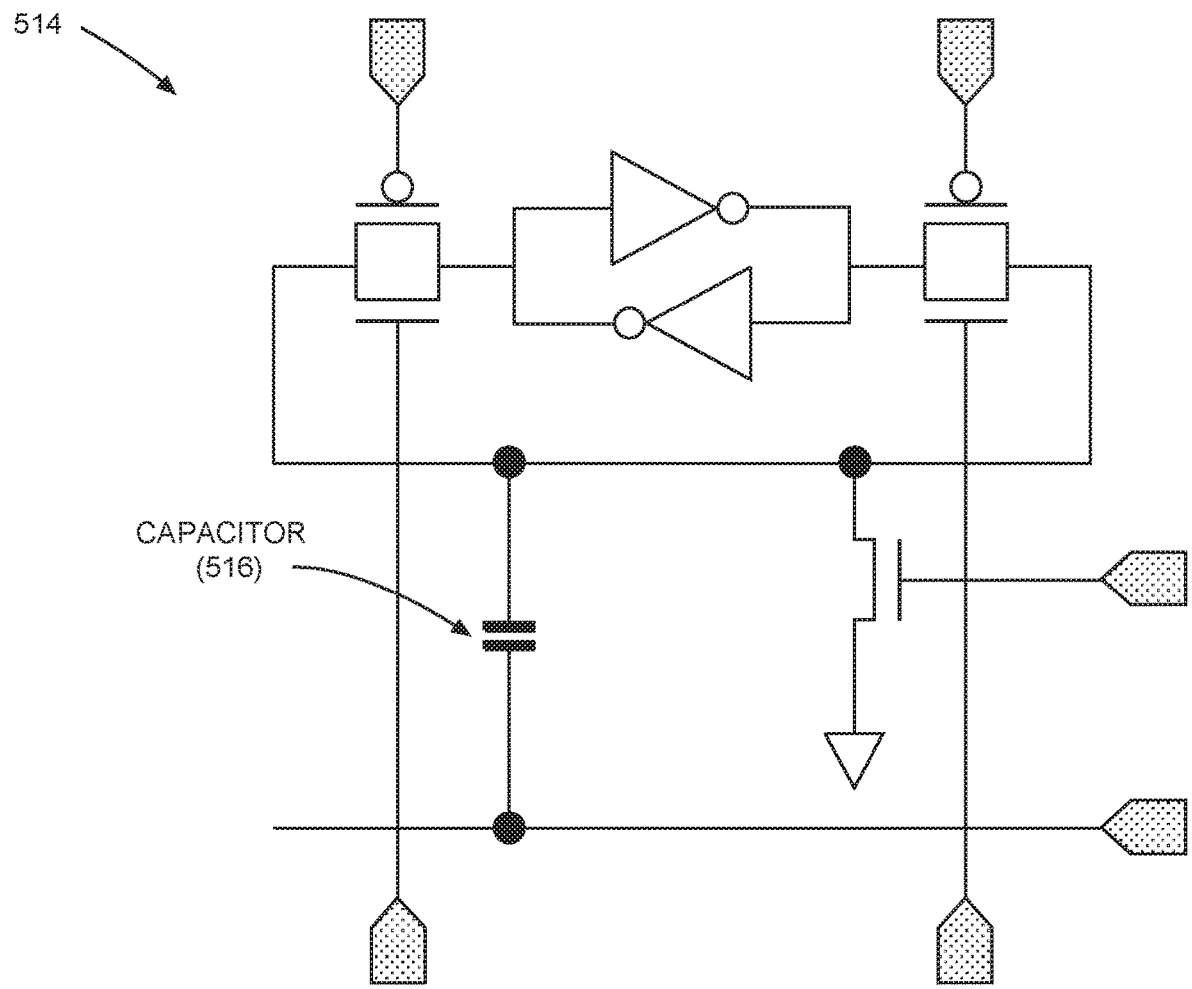
FIG. 5D is a schematic diagram of a bit cell circuit employed in a bit cell corresponding to the MSBs of the multi-bit products in the CIM array circuit in FIG. 5A, including transistors configured to receive a higher supply voltage and a capacitor having a smaller capacitance than the bit cell circuits in the bit cells corresponding to the other bits.

Bit cell circuits 514, as illustrated in FIG. 5D, are employed in the $2^{nd}$ MSB columns 506 of the CIM array circuits 500A and 500B. Whereas the bit cell circuits 504 differ in two aspects from the bit cell circuits 502, the bit cell circuits 514 differ from the bit cell circuits 502 with regard to only either an increased received supply voltage $V_{SUPH}$ or a reduced capacitance of capacitor 516. For example, the bit cell circuits 514 may only receive an increased supply voltage $V_{SUPH}$ (e.g., by increasing a gate oxide thickness and/or increasing a gate length of transistors in the bit cell circuit 514) but not a reduction in capacitance of the capacitor 516. Where higher accuracy is needed but there is a need to stay well below the thermal noise ceiling, determined by KT/C, the additional power consumption caused by the higher supply voltage $V_{SUPH}$, without a smaller capacitor 516, may be acceptable. Alternatively, the bit cell circuits 514 may employ a capacitor 516 having a smaller capacitance where a need for reducing power consumption is higher priority than avoiding the thermal noise ceiling and a level of accuracy is already acceptable. Thus, the bit cell circuit 514 in FIG. 5D has one of a higher supply voltage $V_{SUPH}$ and a smaller capacitor 516. By employing the bit cell circuit 514 in the $2^{nd}$ MSB columns 506, the CIM array circuit 500 in FIG. 5A may offer flexibility in certain regards over the CIM array circuits 300 and 400 in FIGS. 3A-3C and 4A-4C.

Figure 6A:
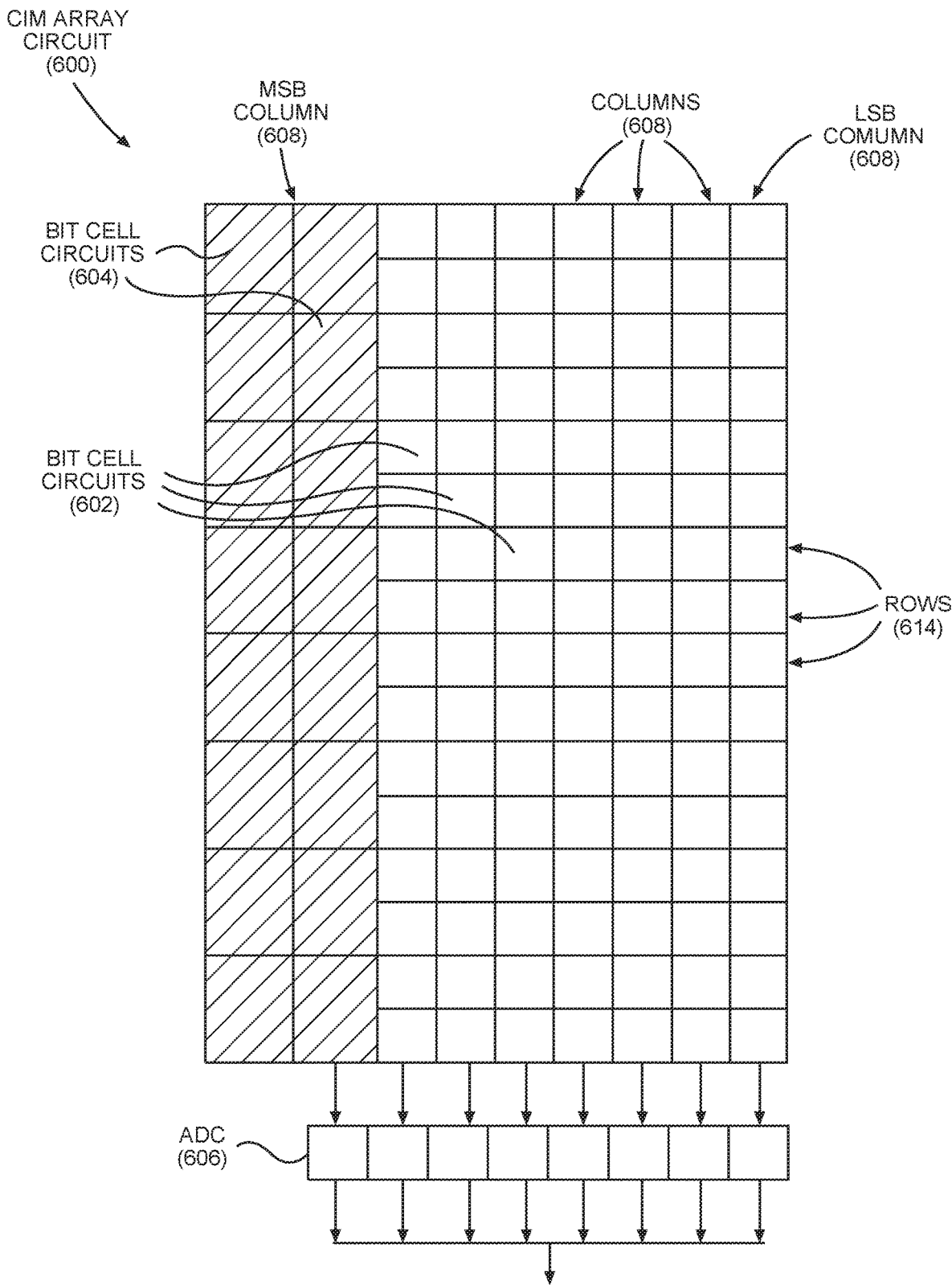
FIG. 6A is a schematic view of a CIM array circuit similar to the CIM array circuit in FIG. 3A in which bit cell circuits in bit cells corresponding to the MSBs of multi-bit products are larger in area to receive a higher supply voltage than the bit cell circuits of the bit cells corresponding to other bits of the multi-bit products other than the MSBs.
Figure 6B:
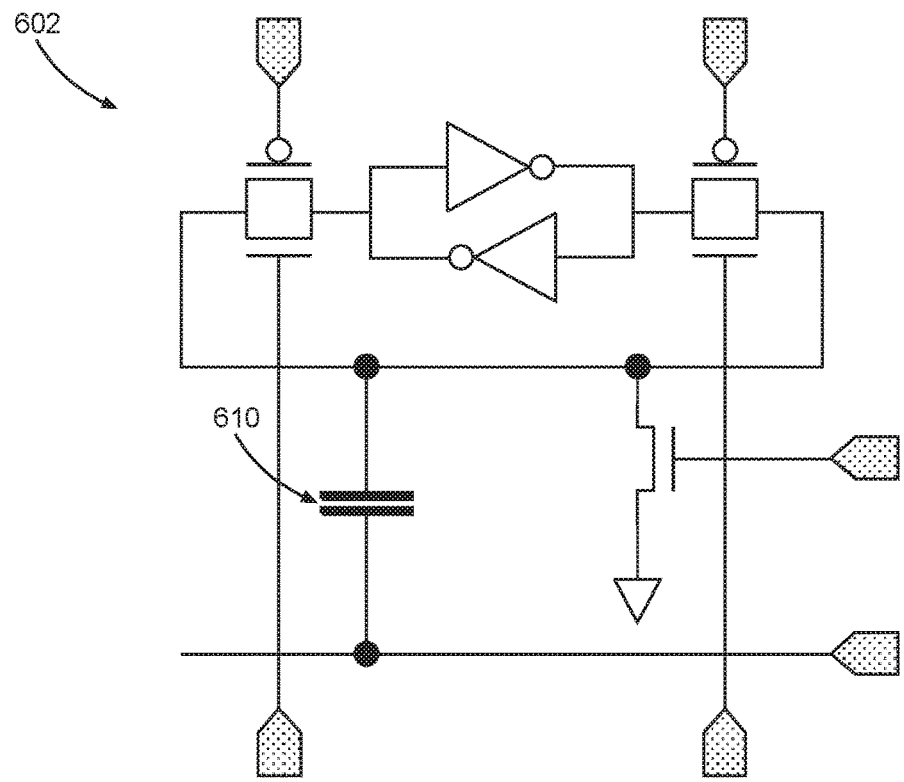
FIG. 6B is a schematic diagram of a bit cell circuit employed in bit cells corresponding to the other bits in the CIM array circuit in FIG. 6A.
Figure 6C:
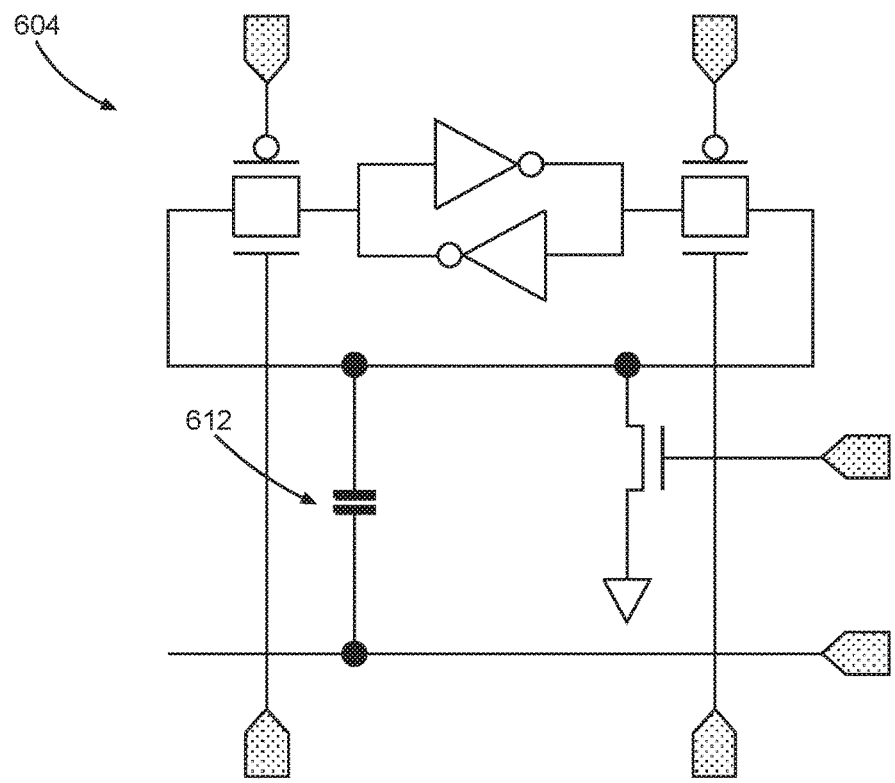
FIG. 6C is a schematic diagram of a bit cell circuit employed in the bit cells corresponding to the MSBs of the multi-bit products in the CIM array circuit in FIG. 6A employing transistors configured to receive a higher voltage and a capacitor having a smaller capacitance than in the bit cell circuits employed in bit cells corresponding to the other bits.

Another exemplary CIM array circuit 600 is illustrated in FIGS. 6A-6C. Bit cell circuit 602 in FIG. 6B corresponds to the bit cell circuits 302 described above with respect to the CIM array circuit 300 in FIGS. 3A-3C. In addition, bit cell circuit 604 corresponds to the bit cell circuit 306 in FIG. 3C by employing transistors having a higher supply voltage $V_{SUPH}$ than the bit cell circuits 602 to improve accuracy of the ADC 606 in determining a pop-count from the analog voltage $V_{RBL}$ on the output RBL. However, to achieve the higher supply voltage $V_{SUPH}$, the bit cell circuits 604 are larger in area than the bit cell circuits 602. A larger area may be needed to account for larger gate lengths in the transistors of the bit cell circuits 604, and and/or the gate oxide thicknesses of the transistors. The LSB columns 608 of the CIM array circuits 600A and 600B include the bit cell circuits 602. The MSB columns 608 of the CIM array circuits 600A and 600B include the bit cell circuits 604 employing transistors receiving a higher supply voltage $V_{SUPH}$ than the bit cell circuits 602 in the LSB columns 608, and having a capacitor 612 with a smaller capacitance than a capacitor 610 in the bit cell circuit 602 in FIG. 6B.

As shown in FIG. 6A, the bit cell circuits 604 in the MSB columns 608 are larger in area than the bit cell circuits 602 in the LSB columns 608. Due to this size difference, the bit cell circuits 604 in the MSB columns 608 cannot be physically organized in rows 614 and columns 608 as in FIGS. 3A, 4A, and 5A. Consequently, the orientation of the bit cell circuits 604 in the MSB columns 608 may be modified to accommodate the larger bit cell circuits 604, while still being logically organized in rows, like the bit cell arrays 204 in FIG. 2A. In the example in FIG. 6A, bit cell circuits 604 for MSBs may be physically positioned in pairs beside each other in a row direction for space efficiency, while still being functionally organized as a single column.

CIM array circuits disclosed herein that include bit cell circuits employed in bit cells corresponding to MSBs of multi-bit products generated by arrays of bit cells that are configured to receive a higher supply voltage for increased accuracy and have a capacitor with a smaller capacitance than a bit cell circuit of bit cells corresponding to other bits of the multi-bit product to mitigate an increase in power consumption, as illustrated in any of FIGS. 3A, 4A, 5A, and 6A, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopier.

Figure 7:
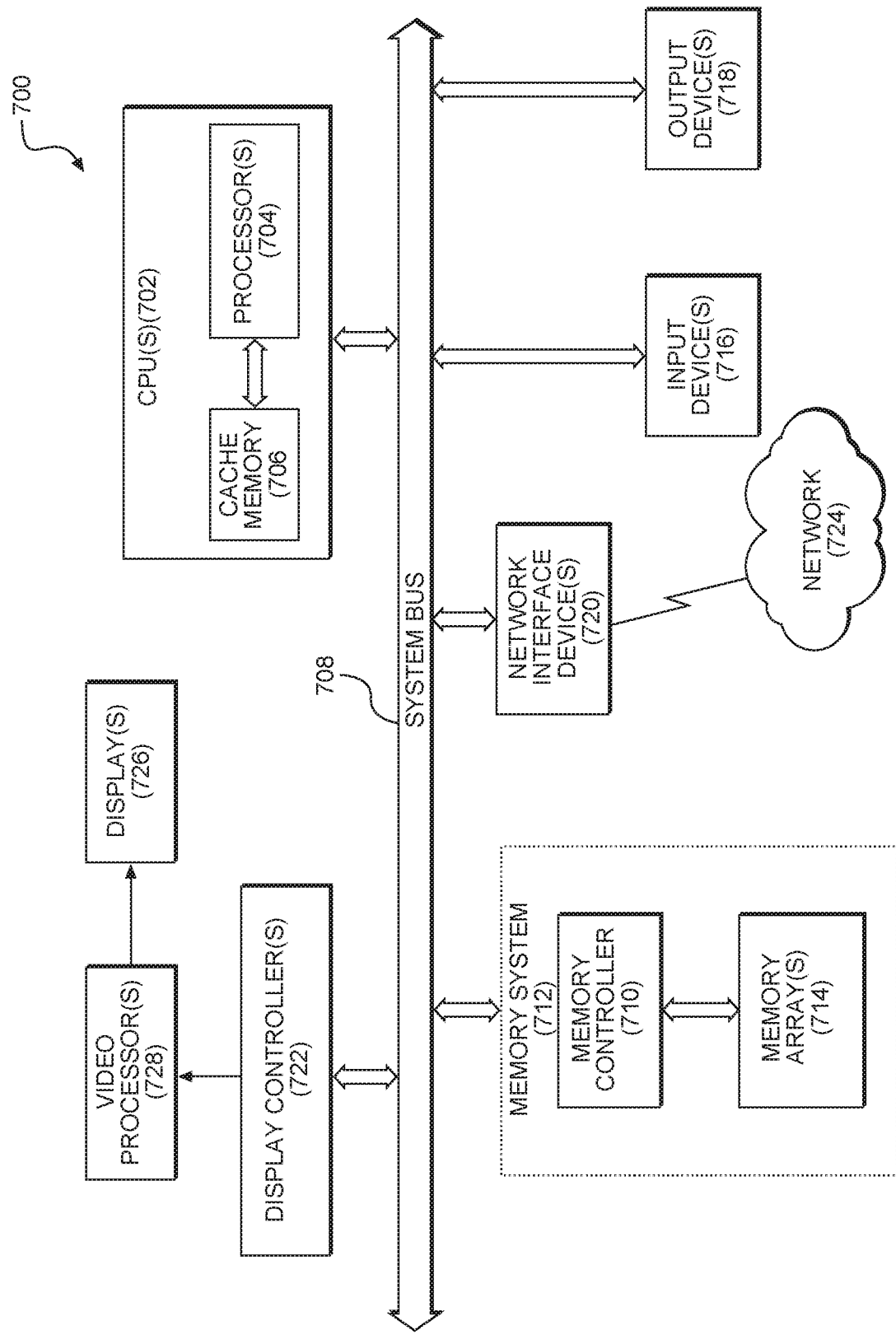
FIG. 7 is a block diagram of an exemplary processor-based system that can include an integrated circuit (IC) including a CIM array circuit in which a bit cell circuit employed in bit cells corresponding to MSBs of multi-bit products generated by arrays of bit cells is configured to receive a higher supply voltage and/or have a capacitor with a smaller capacitance than a bit cell circuit of bit cells corresponding to other bits of the multi-bit product other than the MSB, as illustrated in any of FIGS. 3A, 4A, 5A, and 6A.

In this regard, FIG. 7 illustrates an example of a processor-based system 700 including CIM array circuits including bit cell circuits employed in bit cells corresponding to MSBs of multi-bit products generated by arrays of bit cells that are configured to receive a higher supply voltage for increased accuracy and have a capacitor with a smaller capacitance than a bit cell circuit of bit cells corresponding to other bits of the multi-bit product to mitigate an increase in power consumption, as illustrated in any of FIGS. 3A, 4A, 5A, and 6A, and according to any aspects disclosed herein. In this example, the processor-based system 700 includes one or more central processor units (CPUs) 702, which may also be referred to as CPU or processor cores, each including one or more processors 704. The CPU(s) 702 may have cache memory 706 coupled to the processor(s) 704 for rapid access to temporarily stored data. As an example, the processor(s) 704 could include CIM array circuits including bit cell circuits employed in bit cells corresponding to MSBs of multi-bit products generated by arrays of bit cells that are configured to receive a higher supply voltage for increased accuracy and have a capacitor with a smaller capacitance than a bit cell circuit of bit cells corresponding to other bits of the multi-bit product to mitigate an increase in power consumption, as illustrated in any of FIGS. 3A, 4A, 5A, and 6A, and according to any aspects disclosed herein. The CPU(s) 702 is coupled to a system bus 708 and can intercouple master and slave devices included in the processor-based system 700. As is well known, the CPU(s) 702 communicates with these other devices by exchanging address, control, and data information over the system bus 708. For example, the CPU(s) 702 can communicate bus transaction requests to a memory controller 710 as an example of a slave device. Although not illustrated in FIG. 7, multiple system buses 708 could be provided, wherein each system bus 708 constitutes a different fabric.

Other master and slave devices can be connected to the system bus 708. As illustrated in FIG. 7, these devices can include a memory system 712 that includes the memory controller 710 and one or more memory arrays 714, one or more input devices 716, one or more output devices 718, one or more network interface devices 720, and one or more display controllers 722, as examples. Each of the memory system 712, the one or more input devices 716, the one or more output devices 718, the one or more network interface devices 720, and the one or more display controllers 722 can include OM array circuits including bit cell circuits employed in bit cells corresponding to MSBs of multi-bit products generated by arrays of bit cells that are configured to receive a higher supply voltage for increased accuracy and have a capacitor with a smaller capacitance than a bit cell circuit of bit cells corresponding to other bits of the multi-bit product to mitigate an increase in power consumption, as illustrated in any of FIGS. 3A, 4A, 5A, and 6A, and according to any aspects disclosed herein. The input device(s) 716 can include any type of input device, including, but not limited to, input keys, switches, voice processors, etc. The output device(s) 718 can include any type of output device, including, but not limited to, audio, video, other visual indicators, etc. The network interface device(s) 720 can be any device configured to allow exchange of data to and from a network 724. The network 724 can be any type of network, including, but not limited to, a wired or wireless network, a private or public network, a local area network (LAIN), a wireless local area network (WLAN), a wide area network (WAN), a BLUETOOTH™ network, and the Internet. The network interface device(s) 720 can be configured to support any type of communications protocol desired.

The CPU(s) 702 may also be configured to access the display controller(s) 722 over the system bus 708 to control information sent to one or more displays 726. The display controller(s) 722 sends information to the display(s) 726 to be displayed via one or more video processors 728, which process the information to be displayed into a format suitable for the display(s) 726. The display(s) 726 can include any type of display, including, but not limited to, a cathode ray tube (CRT), a liquid crystal display (LCD), a plasma display, a light emitting diode (LED) display, etc. The display controller(s) 722, display(s) 726, and/or the video processor(s) 728 can include OM array circuits including bit cell circuits employed in bit cells corresponding to MSBs of multi-bit products generated by arrays of bit cells that are configured to receive a higher supply voltage for increased accuracy and have a capacitor with a smaller capacitance than a bit cell circuit of bit cells corresponding to other bits of the multi-bit product to mitigate an increase in power consumption, as illustrated in any of FIGS. 3A, 4A, 5A, and 6A, and according to any aspects disclosed herein.

Figure 8:
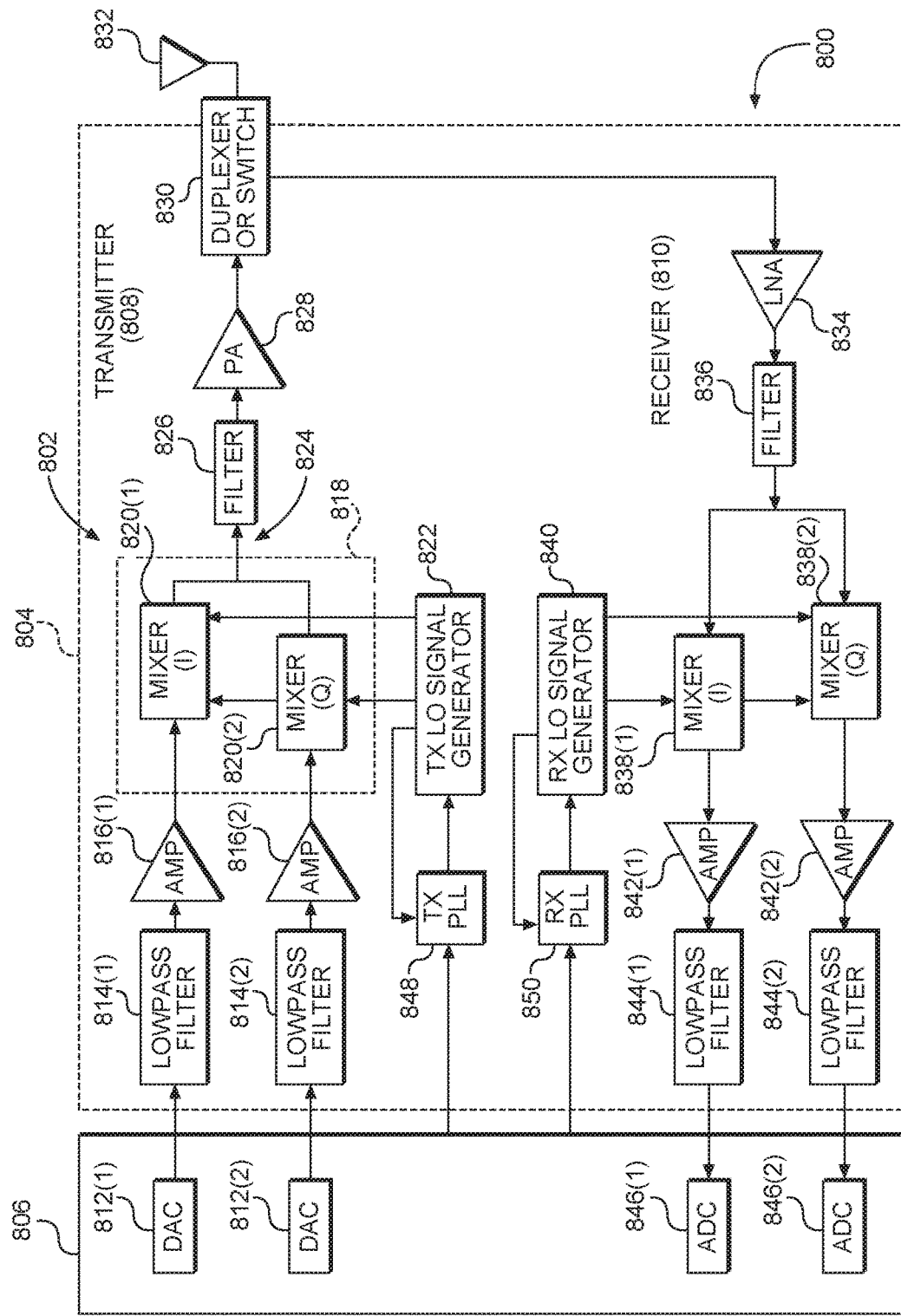
FIG. 8 is a block diagram of an exemplary wireless communications device that includes radio frequency (RF) components formed from an IC, wherein the IC can include a CIM array circuit in which a bit cell circuit employed in bit cells corresponding to MSBs of multi-bit products generated by arrays of bit cells is configured to receive a higher supply voltage and/or have a capacitor with a smaller capacitance than a bit cell circuit of bit cells corresponding to other bits of the multi-bit product other than the MSB, as illustrated in any of FIGS. 3A, 4A, 5A, and 6A.

FIG. 8 illustrates an exemplary wireless communications device 800 that includes radio frequency (RF) components formed from an IC 802, wherein any of the components therein can include CIM array circuits including bit cell circuits employed in bit cells corresponding to MSBs of multi-bit products generated by arrays of bit cells that are configured to receive a higher supply voltage for increased accuracy and have a capacitor with a smaller capacitance than a bit cell circuit of bit cells corresponding to other bits of the multi-bit product to mitigate an increase in power consumption, as illustrated in any of FIGS. 3A, 4A, 5A, and 6A, and according to any aspects disclosed herein. The wireless communications device 800 may include or be provided in any of the above-referenced devices, as examples. As shown in FIG. 8, the wireless communications device 800 includes a transceiver 804 and a data processor 806. The data processor 806 may include a memory to store data and program codes. The transceiver 804 includes a transmitter 808 and a receiver 810 that support bi-directional communications. In general, the wireless communications device 800 may include any number of transmitters 808 and/or receivers 810 for any number of communication systems and frequency bands. All or a portion of the transceiver 804 may be implemented on one or more analog ICs, RF ICs (RFICs), mixed-signal ICs, etc.

The transmitter 808 or the receiver 810 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 810. In the direct-conversion architecture, a signal is frequency-convened between RF and baseband in one stage. The super-heterodyne and direct-conversion architectures may use different circuit blocks and/or have different requirements. In the wireless communications device 800 in FIG. 8, the transmitter 808 and the receiver 810 are implemented with the direct-conversion architecture.

In the transmit path, the data processor 806 processes data to be transmitted and provides I and Q analog output signals to the transmitter 808. In the exemplary wireless communications device 800, the data processor 806 includes digital-to-analog converters (DACs) 812(1), 812(2) for converting digital signals generated by the data processor 806 into the I and Q analog output signals, e.g., I and Q output currents, for further processing.

Within the transmitter 808, lowpass filters 814(1), 814(2) filter the I and Q analog output signals, respectively, to remove undesired signals caused by the prior digital-to-analog conversion. Amplifiers (AMPs) 816(1), 816(2) amplify the signals from the lowpass filters 814(1), 814(2), respectively, and provide I and Q baseband signals. An upconverter 818 upconverts the I and Q baseband signals with I and Q transmit (TX) local oscillator (LO) signals through mixers 820(1), 820(2) from a TX LO signal generator 822 to provide an upconverted signal 824. A filter 826 filters the upconverted signal 824 to remove undesired signals caused by the frequency upconversion as well as noise in a receive frequency band. A power amplifier (PA) 828 amplifies the upconverted signal 824 from the filter 826 to obtain the desired output power level and provides a transmitted RF signal. The transmitted RE signal is routed through a duplexer or switch 830 and transmitted via an antenna 832.

In the receive path, the antenna 832 receives signals transmitted by base stations and provides a received RF signal, which is routed through the duplexer or switch 830 and provided to a low noise amplifier (LNA) 834. The duplexer or switch 830 is designed to operate with a specific receive (RX)-to-TX duplexer frequency separation, such that RX signals are isolated from TX signals. The received RF signal is amplified by the LNA 834 and filtered by a filter 836 to obtain a desired RF input signal. Downconversion mixers 838(1), 838(2) mix the output of the filter 836 with I and Q RX LO signals (i.e., LO_I and LO_Q) from an RX LO signal generator 840 to generate I and Q baseband signals. The I and Q baseband signals are amplified by AMPS 842(1), 842(2) and further filtered by lowpass filters 844(1), 844(2) to obtain I and Q analog input signals, which are provided to the data processor 806. In this example, the data processor 806 includes ADCs 846(1), 846(2) for converting the analog input signals into digital signals to be further processed by the data processor 806.

In the wireless communications device 800 of FIG. 8, the TX LO signal generator 822 generates the I and Q TX LO signals used for frequency upconversion, while the RX LO signal generator 840 generates the I and Q RX LO signals used for frequency downconversion. Each LO signal is a periodic signal with a particular fundamental frequency. A TX phase-locked loop (PLL) circuit 848 receives timing information from the data processor 806 and generates a control signal used to adjust the frequency and/or phase of the TX LO signals from the TX LO signal generator 822. Similarly, an RX PLL circuit 850 receives timing information from the data processor 806 and generates a control signal used to adjust the frequency and/or phase of the RX LO signals from the RX LO signal generator 840.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. A compute-in-memory (CIM) array circuit, comprising:
   a first array of bit cells configured to generate a first multi-bit product, the first array of bit cells comprising a first most-significant bit (MSB) bit cell corresponding to an MSB of the first multi-bit product and a first less-significant bit bit cell corresponding to a less-significant bit of the first multi-bit product than the MSB, each bit cell of the first array of bit cells comprising a bit cell circuit, wherein:
   each bit cell circuit comprises:
      a plurality of inputs each configured to receive a binary input signal; and
      a capacitor configured to be set to a voltage indicating a binary output;
   each bit cell circuit is configured to:
      store a bit of a weight array; and
      generate the binary output based on the plurality of inputs and the bit of the weight array;
   a bit cell circuit of the first MSB bit cell is configured to receive a first voltage that is higher than a second voltage received in a bit cell circuit of the first less-significant bit bit cell; and
   the first multi-bit product comprises the voltage indicating the binary output of each bit cell circuit in the first array of bit cells.

2. The CIM array circuit of claim 1, wherein a first transistor of a plurality of transistors in the bit cell circuit of the first MSB bit cell is configured to receive the first voltage and a second transistor of a plurality of transistors in the bit cell circuit of the first less-significant bit bit cell is configured to receive the second voltage.

3. The CIM array circuit of claim 2, wherein the first transistor comprises a thicker gate oxide than the second transistor.

4. The CIM array circuit of claim 2, wherein the first transistor comprises a longer gate length than the second transistor.

5. The CIM array circuit of claim 2, wherein each of the plurality of transistors in the bit cell circuit of the first less-significant bit bit cell is configured to receive the second voltage.

6. The CIM array circuit of claim 2, wherein the first transistor of the plurality of transistors in the bit cell circuit of the first MSB bit cell is a transistor in a static random access memory (RAM) (SRAM) circuit or in a switch configured to provide access to the SRAM circuit.

7. The CIM array circuit of claim 1, further comprising a second array of bit cells configured to generate a second multi-bit product comprising a second MSB and a second less-significant bit than the second MSB, wherein:
a bit cell circuit of a second MSB bit cell corresponding to the second MSB of the second multi-bit product is configured to receive the first voltage; and
a bit cell circuit of a second less-significant bit bit cell corresponding to the second less-significant bit of the second multi-bit product is configured to receive the second voltage.

8. The CIM array circuit of claim 7, wherein:
the plurality of inputs of each bit cell circuit in the first array of bit cells is coupled to the binary input signal;
a plurality of inputs of each bit cell circuit in the second array of bit cells is coupled to the binary input signal; and
the first array of bit cells and the second array of bit cells are in a first row of the CIM array circuit.

9. The CIM array circuit of claim 7, wherein:
the plurality of inputs of each bit cell circuit in the first array of bit cells is coupled to the binary input signal;
a plurality of inputs of each bit cell circuit in the second array of bit cells is coupled to a second binary input signal; and
a capacitor of the bit cell circuit of the first MSB bit cell and a capacitor of the bit cell circuit of the second MSB bit cell are coupled to a first read bit line.

10. The CIM array circuit of claim 1, wherein:
a bit cell circuit of a first second most-significant bit ($2^{nd}$ MSB) bit cell corresponding to a $2^{nd}$ MSB of the first multi-bit product is configured to receive the first voltage; and
a first transistor of a plurality of transistors in the bit cell circuit of the first $2^{nd}$ MSB bit cell is configured to receive the first voltage.

11. The CIM array circuit of claim 10, wherein a capacitance of a capacitor in the bit cell circuit of the first $2^{nd}$ MSB bit cell is smaller than a capacitance of a capacitor in the bit cell circuit of the first less-significant bit bit cell.

12. The CIM array circuit of claim 1, wherein a capacitance of a capacitor in the bit cell circuit of the first MSB bit cell is smaller than a capacitance of a capacitor in the bit cell circuit of the first less-significant bit bit cell.

13. The CIM array circuit of claim 1, further comprising a second array of bit cells configured to generate a second multi-bit product comprising an MSB, a $2^{nd}$ MSB, and a less-significant bit than the MSB and the $2^{nd}$ MSB, wherein:
a bit cell circuit of a second MSB bit cell corresponding to the MSB of the second multi-bit product is configured to receive the first voltage;
a bit cell circuit of a second $2^{nd}$ MSB bit cell corresponding to the $2^{nd}$ MSB of the second multi-bit product is configured to receive the first voltage; and
a bit cell circuit of a second less-significant bit bit cell corresponding to the less-significant bit of the second multi-bit product is configured to receive the second voltage.

14. The CIM array circuit of claim 1, wherein the first less-significant bit bit cell further comprises a least-significant bit (LSB) of the first multi-bit product.

15. The CIM array circuit of claim 1, wherein:
the bit cell circuit of the first less-significant bit bit cell occupies at least a first area;
the bit cell circuit of the first MSB bit cell occupies at least a second area; and
the second area is larger than the first area.

16. The CIM array circuit of claim 1, wherein each bit cell circuit is configured to generate an exclusive NOT-OR (XNOR) of the binary input signal and the bit of the weight array.

17. The CIM array circuit of claim 1 comprising an integrated circuit (IC).

18. The CIM array circuit of claim 1, integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

19. A compute-in-memory (CIM) array circuit, comprising:
an array of bit cells configured to generate a multi-bit product, each bit cell comprising a bit cell circuit, wherein:
each bit cell circuit comprises:
a plurality of inputs based on a binary input signal; and
a capacitor configured to be set to a voltage indicating a binary output;
each bit cell circuit is configured to:
store a bit of a weight array; and
generate the binary output based on the plurality of inputs and the bit of the weight array; and
a capacitance of a capacitor in a first bit cell circuit is smaller than a capacitance of a capacitor in another bit cell circuit.

* * * * *